United States Patent
Chung et al.

(10) Patent No.: US 7,882,417 B2
(45) Date of Patent: Feb. 1, 2011

(54) SEMICONDUCTOR MEMORY DEVICE AND MEMORY SYSTEM INCLUDING THE SAME

(75) Inventors: Hoe-Ju Chung, Yongin-si (KR); Kyu-Hyoun Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1025 days.

(21) Appl. No.: 11/705,151

(22) Filed: Feb. 12, 2007

(65) Prior Publication Data
US 2007/0204199 A1 Aug. 30, 2007

(30) Foreign Application Priority Data
Feb. 13, 2006 (KR) ............. 10-2006-0013898

(51) Int. Cl.
*G11C 29/00* (2006.01)
*H03M 13/29* (2006.01)

(52) U.S. Cl. ..................... 714/755; 714/773

(58) Field of Classification Search .......... 714/755, 714/773
See application file for complete search history.

(56) References Cited

U.S. PATENT DOCUMENTS

| | | | | |
|---|---|---|---|---|
| 5,206,865 A * | 4/1993 | Gruender et al. | ............. | 714/767 |
| 5,490,155 A * | 2/1996 | Abdoo et al. | ............. | 714/763 |
| 5,734,664 A * | 3/1998 | Saxena | ............. | 714/766 |
| 6,076,182 A * | 6/2000 | Jeddeloh | ............. | 714/763 |
| 6,147,924 A | 11/2000 | Lee et al. | | |
| 6,662,333 B1 * | 12/2003 | Zhang et al. | ............. | 714/767 |
| 6,691,276 B2 * | 2/2004 | Holman | ............. | 714/767 |
| 7,117,421 B1 * | 10/2006 | Danilak | ............. | 714/763 |
| 7,149,869 B2 * | 12/2006 | Singh | ............. | 711/173 |
| 7,237,176 B2 * | 6/2007 | Briggs et al. | ............. | 714/767 |
| 7,530,008 B2 * | 5/2009 | Das et al. | ............. | 714/784 |
| 7,721,178 B2 * | 5/2010 | Dell et al. | ............. | 714/752 |

FOREIGN PATENT DOCUMENTS

| | | |
|---|---|---|
| JP | 2002-223203 | 8/2002 |
| KR | 10-0380023 | 4/2003 |
| KR | 10-2006-0022144 | 3/2006 |

OTHER PUBLICATIONS

Office Action for corresponding Korean Application No. 10-2006-0013898 dated Jun. 25, 2007.

* cited by examiner

*Primary Examiner*—Stephen M Baker
(74) *Attorney, Agent, or Firm*—Harness, Dickey & Pierce, P.L.C.

(57) ABSTRACT

A semiconductor memory device and a memory system including the same are provided. The semiconductor memory device may include a first memory cell array block generating first data, a second memory cell array block generating second data, and first and second error detection code generators. The first error detection code generator may generate a first error detection code and may combine a portion of bits of the first error detection code with a portion of bits of a second error detection code to generate a first final error detection signal. The second error detection code generator may generate the second error detection code and may combine the remaining bits other than the portion of bits of the second error detection code with the remaining bits other than the portion of bits of the first error detection code to generate a second final error detection signal.

43 Claims, 10 Drawing Sheets

SEMICONDUCTOR MEMORY DEVICE AND MEMORY SYSTEM INCLUDING THE SAME

PRIORITY STATEMENT

This application claims the benefit of Korean Patent Application No. 2006-13898, filed Feb. 13, 2006, the entire contents of which is incorporated herein by reference.

BACKGROUND OF THE INVENTION

1. Field of the Invention

Example embodiments relate to a semiconductor memory device, and more particularly, to a semiconductor memory device having an Outer Data Inner Control (ODIC) pad structure and a memory system including the same.

2. Description of the Related Art

A conventional semiconductor memory device having an ODIC pad structure has a structure in which data pads are disposed at both sides thereof and a command pad is disposed at an inner side thereof. Data input and output via the data pad disposed at one side may be input and output through only a memory cell array block disposed at one side, and data input and output via the data pad disposed at the other side may be input and output through only a memory cell array block disposed at the other side.

FIG. 1 is a block diagram of a conventional semiconductor memory device having an ODIC pad structure, which may include four memory cell array blocks BLK1 to BLK4, for example.

Referring to FIG. 1, a first group of data pads DQ1, address/command signal applying pads CMD/ADD and a second group of data pads DQ2 may be arranged in a line between a region where the memory cell array blocks BLK1 and BLK3 are disposed and a region where the memory cell array blocks BLK2 and BLK4 are disposed. As shown in FIG. 1, the semiconductor memory device having the ODIC pad structure may have a first group of data pads DQ1 and a second group of data pads DQ2 disposed at both sides thereof, and the address/command signal applying pads CMD/ADD disposed at the center thereof.

Referring to FIG. 1, data DO1 and DO2 input/output to/from the memory cell array blocks BLK1 and BLK2 may be input/output via the first group of data pads DQ1 and data DO3 and DO4 input/output to/from the memory cell array blocks BLK3 and BLK4 may be input/output via the second group of data pads DQ2.

Conventional semiconductor memory devices may transmit data and an error detection code added to the data during a data transmission. For this purpose, conventional semiconductor memory devices may be provided with an error detection code generator. An error detection code generator may generate error detection codes for data of all bits output from the memory cell array blocks BLK1 to BLK4. If data is selectively output from the memory cell array blocks BLK1 and BLK3 or the memory cell array blocks BLK2 and BLK4, the generator may generate an error detection code for the data DO1 and DO4 or the data DO2 and DO3, for example.

However, if the error detection code generator is disposed in a region A between regions where the blocks BLK1 to BLK4 are disposed and the data are output from the data DO1 and DO4 or the data DO2 and DO3, the data DO1 and DO4 or the data DO2 and DO3 should be input to the error detection code generator. Accordingly, signal lines for transmitting the data DO1 and DO2 and signal lines for transmitting the data DO3 and DO4 are generally disposed at the side of the error detection code generator. This not only increases the layout area of conventional semiconductor memory devices but also delays signal transmission due to increased length of the signal line or lines used to provide the data DO1, DO2, DO3 and DO4 to the error detection code generator.

Similar problems still in occur in conventional semiconductor memory devices even if the error detection code generator is disposed in a region B between regions where the memory cell array blocks BLK1 and BLK2 are disposed or in a region C between regions where the memory cell array blocks BLK3 and BLK4 are disposed.

SUMMARY

An example embodiment may provide a semiconductor memory device capable of generating an error detection code without degrading error detection ability and without increasing a layout area.

An example embodiment provides a memory system including a semiconductor memory device.

According to an example embodiment, a semiconductor memory device may include a first memory cell array block generating first data; a second memory cell array block generating second data; a first error detection code generator generating a first error detection code for the first data and combining a portion of bits of the first error detection code with a portion of bits of a second error detection code to generate a first final error detection signal; and a second error detection code generator generating the second error detection code for the second data and combining the remaining bits other than the portion of bits of the second error detection code with the remaining bits other than the portion of bits of the first error detection code to generate a second final error detection signal.

According to an example embodiment, each of a first and second error detection code generation circuits may include an XOR circuit implemented using a cyclic redundancy check code and using the same error detection code generation polynomial as each other. Each of the first and second error detection code generation circuits may include an XOR circuit implemented using a cyclic redundancy check code and using different error detection code generation polynomials from each other.

According to an example embodiment, a semiconductor memory device may also include a first parallel-serial converter converting the first data and the first final error detection signal to serial data and outputting the serial data; and a second parallel-serial converter converting the second data and the second final error detection signal to serial data and outputting the serial data.

An example embodiment of a semiconductor memory device may have an Outer Data Inner Control (ODIC) pad structure. A first error detection code generator may be disposed adjacent to a first data pad outputting the first data and the first final error detection signal, and a second error detection code generator may be disposed adjacent to a second data pad outputting the second data and the second final error detection signal.

An example embodiment of a semiconductor memory device may also include a third error detection code generator generating a third error detection code for third data that is externally applied and combining a portion of bits of the third error detection code with a portion of bits of a fourth error detection code to generate a third final error detection signal; a fourth error detection code generator generating the fourth error detection code for fourth data that is externally applied and combining the remaining bits other than the portion of bits of the fourth error detection code with the remaining bits other than the portion of bits of the third error detection code to generate a fourth final error detection signal; and an error detector comparing a third final error detection signal that is externally applied with the third final error detection signal and comparing a fourth final error detection signal that is externally applied with the fourth final error detection signal to generate an error detection signal. Each of the third and fourth error detection code generation circuits may be implemented using a cyclic redundancy check code and may have an XOR circuit using the same error detection code generation polynomial as each other. Each of the third and fourth error detection code generation circuits may be implemented using a cyclic redundancy check code and may have an XOR circuit using different error detection code generation polynomials from each other. The semiconductor memory device may also include a first serial-parallel converter converting the third data that is externally applied and the third final error detection signal to parallel data and outputting the parallel data; and a second serial-parallel converter converting the fourth data that is externally applied and the fourth final error detection signal to parallel data and outputting the parallel data.

In addition, an example embodiment of a semiconductor memory device may also include a third error detection code generator generating a third error detection code for the first data and combining a portion of bits of the third error detection code with a portion of bits of a fourth error detection code to generate the first final error detection signal; and a fourth error detection code generator generating the fourth error detection code for the second data and combining the remaining bits other than the portion of bits of the fourth error detection code with the remaining bits other than the portion of bits of the third error detection code to generate the second final error detection signal. Each of the first to fourth error detection code generation circuits may be implemented using a cyclic redundancy check code. Each of the first and third error detection code generation circuits may have a first XOR circuit using different error detection code generation polynomials from each other. Each of the second and fourth error detection code generation circuits may have a second XOR circuit using different error detection code generation polynomials from each other. The semiconductor memory device may also include a controller for periodically and alternately enabling the first and second error detection code generators, and the third and fourth error detection code generators.

A semiconductor device according to another example embodiment may include a first memory cell array block generating 2n bits of first data in a first bit structure mode and generating n bits of the first data in a second bit structure mode; a second memory cell array block generating 2n bits of second data in the first bit structure mode and generating n bits of the second data in the second bit structure mode; a first error detection code generator generating upper n bits of the 2n bits of first data in the first bit structure mode and a first error detection code for the n bits of first data in the second bit structure mode and combining a portion of bits of the first error detection code with a portion of bits of a third error detection code to generate a portion of bits of a first final error detection signal; a second error detection code generator generating a second error detection code for lower n bits of the 2n bits of first data in the first bit structure mode and combining a portion of bits of the second error detection code with a portion of bits of a fourth error detection code to generate the remaining bits other than the portion of bits of the first final error detection signal; a third error detection code generator generating upper n bits of the 2n bits of second data in the first bit structure mode and the third error detection code for the n bits of second data in the second bit structure mode and combining the remaining bits other than the portion of bits of the third error detection code with the remaining bits other than the portion of bits of the first error detection code to generate a portion of bits of a second final error detection signal; and a fourth error detection code generator generating the fourth error detection code for lower n bits of the 2n bits of second data in the first bit structure mode and combining the remaining bits other than the portion of bits of the fourth error detection code with the remaining bits other than the portion of bits of the second error detection code to generate the remaining bits other than the portion of bits of the second final error detection signal.

Still further, the semiconductor memory device may include a fifth error detection code generator generating the upper n bits of the 2n bits of first data in the first bit structure mode and a fifth error detection code for n bits of the first data in the second bit structure mode and combining a portion of bits of the fifth error detection code with a portion of bits of a seventh error detection code to generate a portion of bits of the first final error detection signal; a sixth error detection code generator generating a sixth error detection code for the lower n bits of the 2n bits of first data in the first bit structure mode and combining a portion of bits of the sixth error detection code with a portion of bits of an eighth error detection code to generate the remaining bits other than the portion of bits of the first final error detection signal; a seventh error detection code generator generating upper n bits of the 2n bits of second data in the first bit structure mode and the seventh error detection code for n bits of the second data in the second bit structure mode and combining the remaining bits other than the portion of bits of the seventh error detection code with the remaining bits other than the portion of bits of the fifth error detection code to generate a portion of bits of the second final error detection signal; and an eighth error detection code generator generating the eighth error detection code for the lower n bits of the 2n bits of second data in the first bit structure mode and combining the remaining bits other than the portion of bits of the eighth error detection code with the remaining bits other than the portion of bits of the sixth error detection code to generate the remaining bits other than the portion of bits of the second final error detection signal.

According to an example embodiment, the first to eighth error detection code generators may be implemented using a cyclic redundancy check code. Each of the first to fourth error detection code generators may have a first XOR circuit using the same first error detection code generation polynomial, and each of the fifth to eighth error detection code generators may have a second XOR circuit using a second error detection code generation polynomial different from the first error detection code generation polynomial. The semiconductor memory device may also include a controller for periodically and alternately enabling the first to fourth error detection code generators, and the fifth to eighth error detection code generators.

According to an example embodiment, the semiconductor memory device may have an outer data inner control (ODIC) pad structure. The first, second, fifth, and sixth error detection code generators may be disposed adjacent to a first data pad outputting the first data and the first final error detection signal, and the third, fourth, seventh, and eighth error detection code generators may be disposed adjacent to a second data pad outputting the second data and the second final error detection signal.

An example embodiment provides a memory system. The memory system may include a semiconductor memory device, a memory controller and an error detector. The semiconductor memory device may include a first memory cell array block generating first data; a second memory cell array block generating second data; a first error detection code generator generating a first error detection code for the first data and combining a portion of bits of the first error detection code with a portion of bits of the second error detection code to generate a first final error detection signal; and a second error detection code generator generating a second error detection code for the second data and combining the remaining bits other than the portion of bits of the second error detection code with the remaining bits other than the portion of bits of the first error detection code to generate a second final error detection signal. The memory controller may include a third error detection code generator generating a third error detection code for the first data output from the semiconductor memory device and combining a portion of bits of the third error detection code with a portion of bits of a fourth error detection code to generate a third final error detection signal; a fourth error detection code generator generating the fourth error detection code for the second data output from the semiconductor memory device and combining the remaining bits other than the portion of bits of the fourth error detection code with the remaining bits other than the portion of bits of the third error detection code to generate a fourth final error detection signal. The error detector may compare the first final error detection signal output from the semiconductor memory device with the third final error detection signal and may compare the second final error detection signal output from the semiconductor memory device with the fourth final error detection signal to generate an error detection signal.

According to an example embodiment, each of the first to fourth error detection code generators may be implemented using a cyclic redundancy check code. Each of the first and third error detection code generators may have a first XOR circuit using the same first error detection code generation polynomial, and each of the second and fourth error detection code generators may have a second XOR circuit using the same second error detection code generation polynomial.

Another example embodiment provides a memory system that may also include a semiconductor memory device, a memory controller and an error detector. The semiconductor memory device may include a first memory cell array block generating 2n bits of first data in a first bit structure mode and generating n bits of the first data in a second bit structure mode; a second memory cell array block generating 2n bits of second data in the first bit structure mode and generating n bits of the second data in the second bit structure mode; a first error detection code generator generating the upper n bits of the 2n bits of first data in the first bit structure mode and a first error detection code for the upper n bits of the 2n bits of first data in the second bit structure mode and combining a portion of bits of the first error detection code with a portion of bits of a third error detection code to generate a portion of bits of a first final error detection signal; a second error detection code generator generating a second error detection code for lower n bits of the 2n bits of first data in the first bit structure mode and combining a portion of bits of the second error detection code with a portion of bits of a fourth error detection code to generate the remaining bits other than the portion of bits of the first final error detection signal; a third error detection code generator generating upper n bits of the 2n bits of second data in the first bit structure mode and the third error detection code for the upper n bits of the 2n bits of second data in the second bit structure mode and combining the remaining bits other than the portion of bits of the third error detection code with the remaining bits other than the portion of bits of the first error detection code to generate a portion of bits of a second final error detection signal; and a fourth error detection code generator generating a fourth error detection code for the lower n bits of the 2n bits of second data in the first bit structure mode and combining the remaining bits other than the portion of bits of the fourth error detection code with the remaining bits other than the portion of bits of the second error detection code to generate the remaining bits other than the portion of bits of the second final error detection signal. The memory controller may include a fifth error detection code generator generating the upper n bits of the 2n bits of first data output from the semiconductor memory device in the first bit structure mode and a fifth error detection code for the n bits of the first data output from the semiconductor memory device in the second bit structure mode and combining a portion of bits of the fifth error detection code with a portion of bits of a seventh error detection code to generate a portion of bits of a third final error detection signal; a sixth error detection code generator generating a sixth error detection code for the lower n bits of the 2n bits of first data in the first bit structure mode and combining a portion of bits of the sixth error detection code with a portion of bits of an eighth error detection code to generate the remaining bits other than the portion of bits of the third final error detection signal; a seventh error detection code generator generating upper n bits of the 2n bits of second data output from the semiconductor memory device in the first bit structure mode and the seventh error detection code for n bits of the second data in the second bit structure mode and combining the remaining bits other than the portion of bits of the seventh error detection code with the remaining bits other than the portion of bits of the fifth error detection code to generate a portion of bits of a fourth final error detection signal; and an eighth error detection code generator generating the eighth error detection code for lower n bits of the 2n bits of second data in the first bit structure mode and combining the remaining bits other than the portion of bits of the eighth error detection code with the remaining bits other than the portion of bits of the sixth error detection code to generate the remaining bits other than the portion of bits of the fourth final error detection signal. The error detection signal generator may compare the first to fourth final error detection signals output from the semiconductor memory device to generate an error detection signal.

According to an example embodiment, each of the first to eighth error detection code generators may be implemented using a cyclic redundancy check code. Each of the first and fifth error detection code generators may have a first XOR circuit using the same first error detection code generation polynomial. Each of the second and sixth error detection code generators may have a second XOR circuit using the same second error detection code generation polynomial. Each of the third and seventh error detection code generators may have a third XOR circuit using the same third error detection code generation polynomial, and each of the fourth and eighth error detection code generators may have a fourth XOR circuit using the same fourth error detection code generation polynomial.

Another example embodiment provides a data transceiving system. The data transceiving system may include a data transmitter and a data receiver. The data transmitter may include a first error detection code generator generating a first error detection code for upper n bits of 2n bits of first data and combining a portion of bits of the first error detection code with a portion of bits of a third error detection code to generate a portion of bits of a first final error detection signal; a second error detection code generator generating a second error detection code for lower n bits of the 2n bits of first data and combining a portion of bits of the second error detection code with a portion of bits of a fourth error detection code to generate the remaining bits other than the portion of bits of the first final error detection signal; a third error detection code generator generating the third error detection code for upper n bits of 2n bits of second data and combining the remaining bits other than the portion of bits of the third error detection code with the remaining bits other than the portion of bits of the first error detection code to generate a portion of bits of a second final error detection signal; and a fourth error detection code generator generating a fourth error detection code for the lower n bits of the 2n bits of second data and combining the remaining bits other than the portion of bits of the fourth error detection code with the remaining bits other than the portion of bits of the second error detection code to generate the remaining bits other than the portion of bits of the second final error detection signal. The data transmitter may output the first and second data in units of 2n bits and the first and second final error detection signals. The data receiver may include a fifth error detection code generator generating a fifth error detection code for the upper n bits of the 2n bits of first data and combining a portion of bits of the fifth error detection code with a portion of bits of a seventh error detection code to generate a portion of bits of a third final error detection signal; a sixth error detection code generator generating a-sixth error detection code for the lower n bits of the 2n bits of first data and combining a portion of bits of the sixth error detection code with a portion of bits of an eighth error detection code to generate the remaining bits other than the portion of bits of the third final error detection signal; a seventh error detection code generator generating the seventh error detection code for the upper n bits of the 2n bits of second data and combining the remaining bits other than the portion of bits of the seventh error detection code with the remaining bits other than the portion of bits of the fifth error detection code to generate a portion of bits of a fourth final error detection signal; an eighth error detection code generator generating the eighth error detection code for the lower n bits of the 2n bits of second data and combining the remaining bits other than the portion of bits of the eighth error detection code with the remaining bits other than the portion of bits of the sixth error detection code to generate the remaining bits other than the portion of bits of the fourth final error detection signal; and an error detection signal generator comparing the first to fourth final error detection signals to generate an error detection signal.

BRIEF DESCRIPTION OF THE DRAWINGS

The foregoing and other objects, features and advantages of example embodiments will be more apparent from the following detailed description of the example embodiments and the accompanying drawings. The drawings are not necessarily to scale, emphasis instead being placed upon illustrating the principles of the example embodiments.

DETAILED DESCRIPTION OF EXAMPLE EMBODIMENTS

Figure 1:
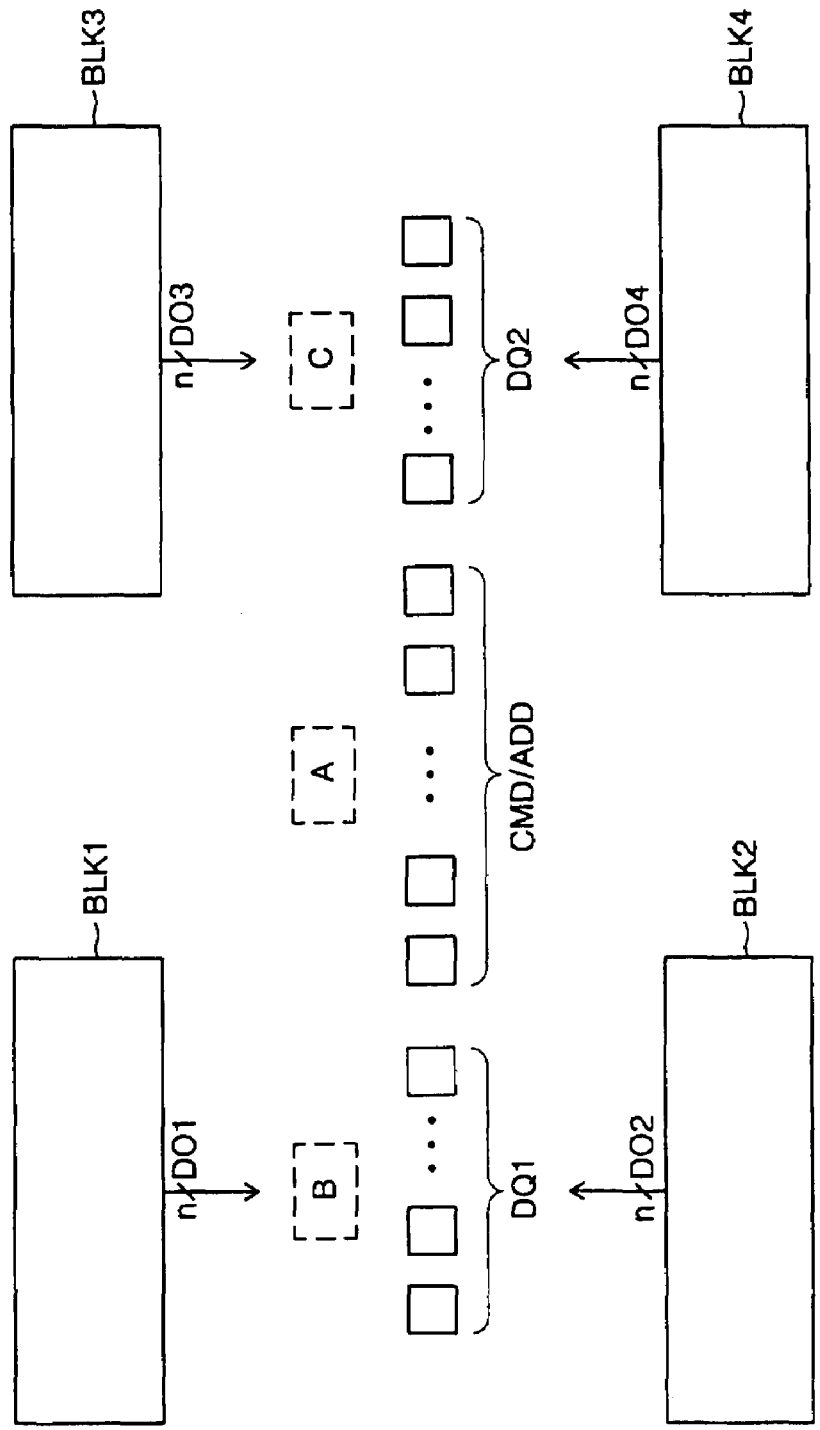
FIG. 1 is a block diagram of a conventional semiconductor memory device having an ODIC pad structure.

Various example embodiments will now be described more fully with reference to the accompanying drawings in which some example embodiments are shown. Detailed example embodiments are disclosed herein. However, specific structural and functional details disclosed herein are merely representative for purposes of describing example embodiments, and one skilled in the art will appreciate that example embodiments may be embodied in many alternate forms and should not be construed as limited to only the embodiments set forth herein.

Accordingly, while example embodiments are capable of various modifications and alternative forms, example embodiments are shown by way of example in the drawings and are described in detail below. It should be understood, however, that there is no intent to limit example embodiments to the particular forms disclosed, but on the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Hereinafter, example embodiments of a semiconductor memory device and example embodiments of a memory system are described with reference to the accompanying drawings.

Figure 2:
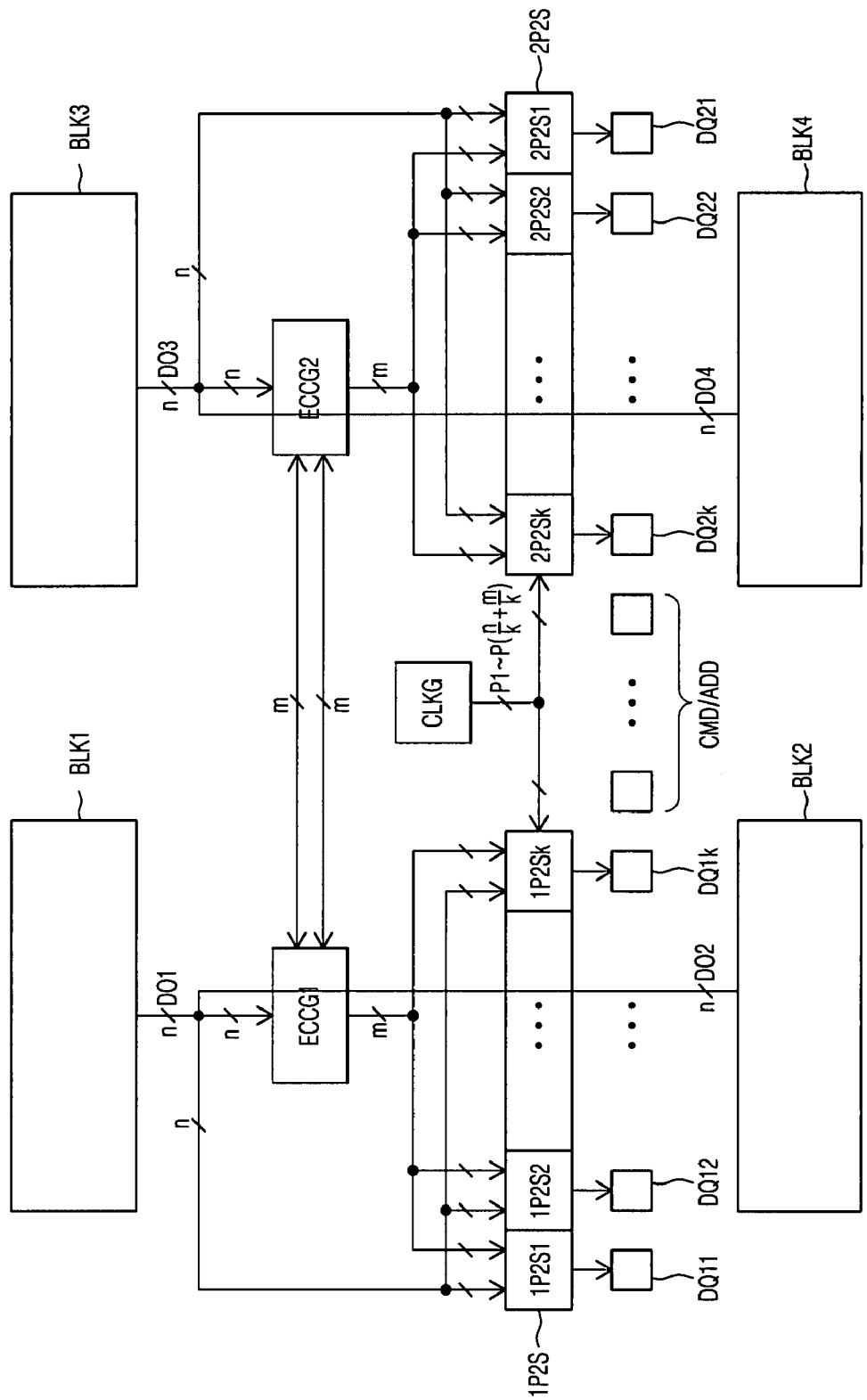
FIG. 2 is a block diagram of an example embodiment of a semiconductor memory device having an ODIC pad structure.

FIG. 2 illustrates a semiconductor memory device having an ODIC pad structure in accordance with an example embodiment. As shown in FIG. 2, the semiconductor memory device may include first to fourth memory cell array blocks BLK1 to BLK4, first and second error detection code generators ECCG1 and ECCG2, first and second parallel-serial converters 1P2S and 2P2S, and a clock signal generator CLKG. The first parallel-serial converter 1P2S may include k parallel-serial converters 1P2S1 to 1P2Sk, and the second parallel-serial converter 2P2S may include k parallel-serial converters 2P2S1 to 2P2Sk.

The pads of FIG. 2 may have ODIC pad structures. In the example embodiment of FIG. 2, DQ11 to DQ1$k$ of FIG. 2 correspond to a first group of data pads and DQ21 to DQ2$k$ correspond to a second group of data pads. Further, data DO1 to DO4 correspond to n-bit data output from the first to fourth memory cell array blocks BLK1 to BLK4, respectively.

The semiconductor memory device illustrated in FIG. 2 may selectively output a total of 2n bits of data DO1 and DO4 from the first and fourth memory cell array blocks BLK1 and BLK4. Alternatively, the semiconductor memory device may selectively output a total of 2n bits of data DO2 and DO3 from the second and third memory cell array blocks BLK2 and BLK3.

Example functions of the components of the semiconductor memory device of FIG. 2 are described below.

The first error detection code generator ECCG1 may receive n-bit data DO1 or DO2 output from the first or second memory cell array block BLK1 or BLK2, respectively, may generate a 2m-bit first error detection code and may combine upper m bits of a 2m-bit first error detection code with an upper m-bit second error detection code transmitted from the second error detection code generator ECCG2 to generate an upper m-bit final error detection code. The second error detection code generator ECCG2 may receive n-bit data DO3 or DO4 output from the third or fourth memory cell array block BLK3 or BLK4, respectively, may generate the 2m-bit second error detection code and may combine lower m bits of the 2m-bit second error detection code with a lower m-bit first error detection code transmitted from the first error detection code generator ECCG1 to generate a lower m-bit final error detection code. The clock signal generator CLKG may generate n/k+m/k clock signals P1~P(n/k+m/k) having different phases in response to an externally applied clock signal (not shown). Alternatively, the clock signal generator CLKG may internally generate n/k+m/k clock signals P1~P(n/k+m/k) having different phases. The parallel-serial converters 1P2S1 to 1P2Sk may convert n/k bits of data and upper m/k bits of the final error detection code into serial data in response to the respective n/k+m/k clock signals P1 to P(n/k+m/k), and may output the serial data via the corresponding pads DQ11 to DQ1$k$. The parallel-serial converters 2P2S1 to 2P2Sk may convert n/k bits of data and the upper m/k bits of the final error detection code into serial data in response to the respective n/k+m/k clock signals P1 to P(n/k+m/k) and may output the serial data via the corresponding pads DQ21 to DQ2$k$.

The semiconductor memory device having the ODIC pad structure shown in FIG. 2 may include a first error detection code generator ECCG1 for generating an error detection code for data output from the first or second memory cell array block BLK1 or BLK2, and a second error detection code generator ECCG2 for generating an error detection code for data output from the third or fourth memory cell array block BLK3 or BLK4. Accordingly, signal lines for transmitting the data DO1 and DO2 and signal lines for transmitting the data DO3 and DO4 may be relatively short compared to those used in conventional semiconductor devices.

The semiconductor memory device having the ODIC pad structure shown in FIG. 2 may transmit the upper m bits of first error detection code from the first error detection code generator ECCG1 to the second error detection code generator ECCG2 and may transmit the lower m bits of second error detection code from the second error detection code generator ECCG2 to the first error detection code generator ECCG1. Accordingly, 2 m signal lines may be relatively long. However, even if the 2 m signal lines are relatively long, the number of the relatively long signal lines is small as compared with the number of signal lines for transmitting data. Therefore, the semiconductor memory device according to the example embodiment described above having the ODIC pad structure may have a reduced layout area as compared to conventional semiconductor memory devices.

Figure 3:
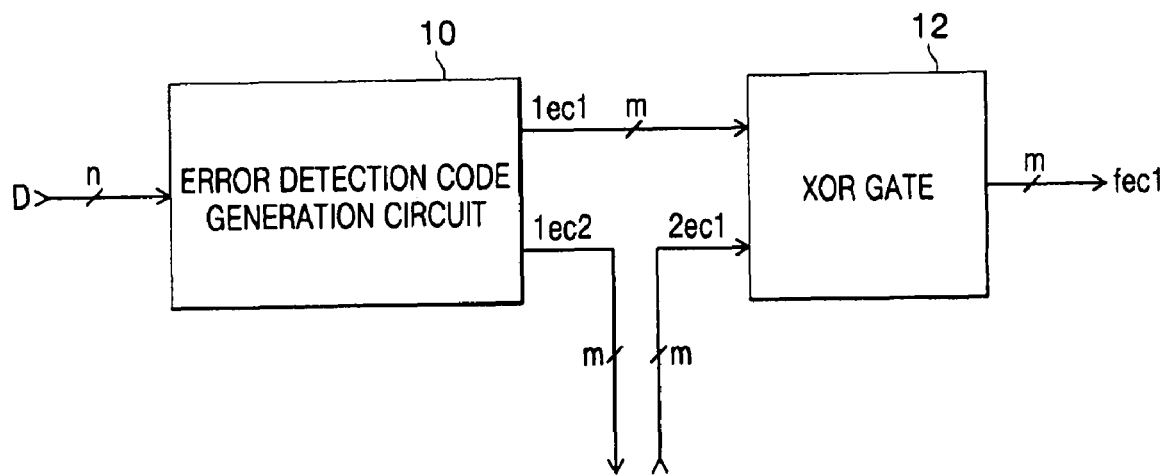
FIG. 3 illustrates an example configuration of a first error detection code generator shown in FIG. 2 in accordance with an example embodiment.

FIG. 3 illustrates an example configuration of the first error detection code generator of FIG. 2. As shown in FIG. 3, the first error detection code generator may include an error detection code generation circuit 10 and an XOR circuit 12, for example.

Example functions of the error detection code generation circuit 10 and the XOR circuit 12 are described below.

The error detection code generation circuit 10, upon receipt of n-bit data D1, may generate 2m-bit first error detection codes 1ec1 and 1ec2 for the n-bit data. The XOR gate 12 may perform an XOR operation on the first error detection code 1ec1, among the 2m-bit first error detection codes 1ec1 and 1ec2, and an upper m-bit second error detection code 2ec1 to generate an upper m-bit final error detection code fec1.

Although not shown, a second error detection code generator may have the same structure as FIG. 3.

Figure 4:
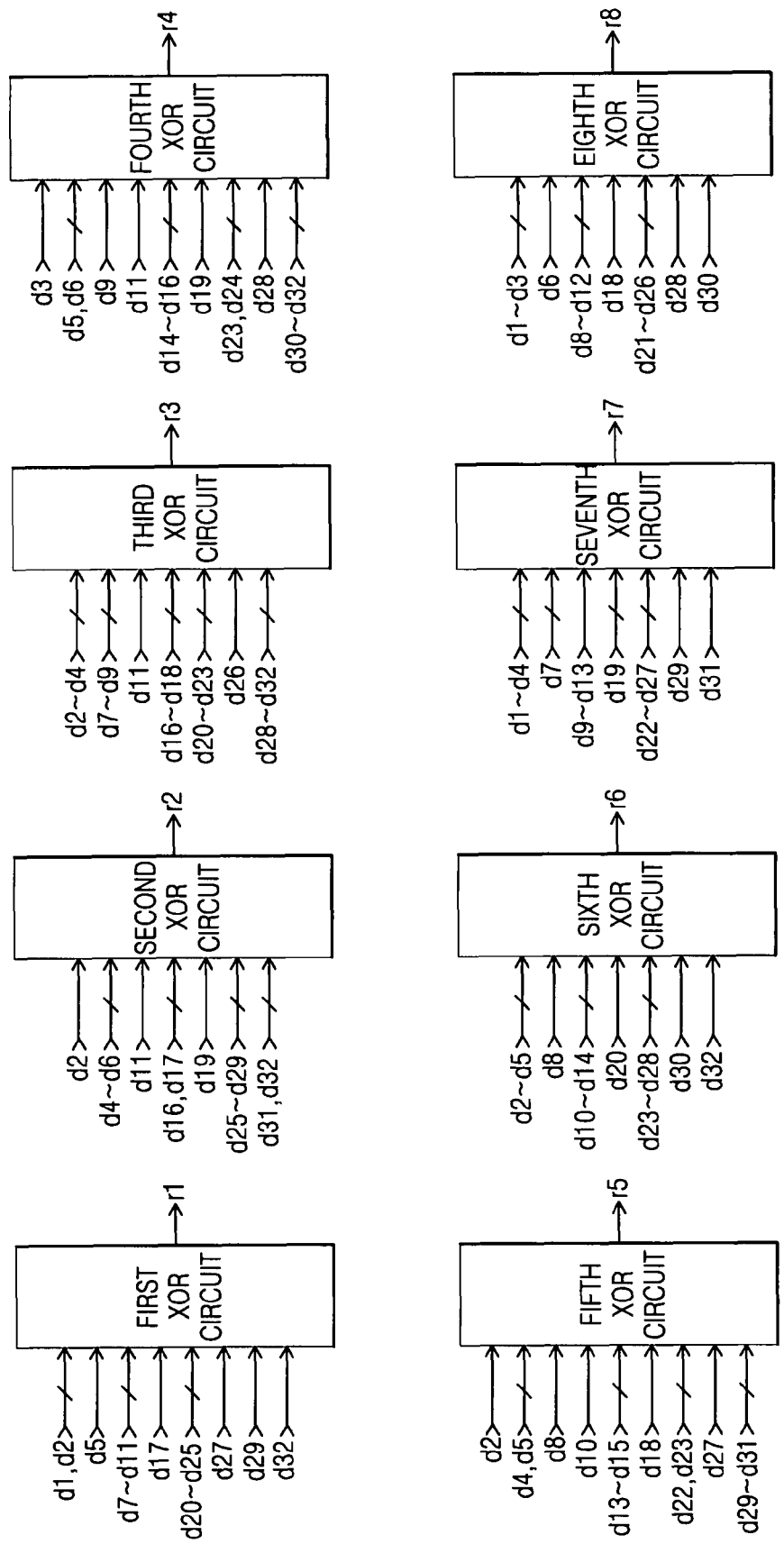
FIG. 4 illustrates an example configuration of an error detection code generation circuit shown in FIG. 3 in accordance with an example embodiment.

FIG. 4 illustrates an example configuration of an error detection code generation circuit of FIG. 3, which may include eight XOR circuits, for example.

The example circuit shown in FIG. 4 may be based on a Cyclic Redundancy Check (CRC) code, wherein an error detection code generation polynomial $X^8+X^5+X^3+X^2+X+1$.

In addition, the error detection code generator of FIG. 4 may generate the remainder as error detection codes r1 to r8. The remainder may be equal to the 40-bit data d32 . . . d10 . . . 0 that are lowest bit data of 32-bit parallel output data d32 to d1 plus "00000000" divided by data "100101111" corresponding to the polynomial.

Referring to FIG. 4, a first XOR circuit may perform an XOR operation on data d1, d2, d5, d7 to d11, d17, d20 to d25, d27, d29 and d32 to generate an error detection code r1; a second XOR circuit may perform an XOR operation on data d2, d4 to d6, d11, d16, d17, d19, d25 to d29, d31 and d32 to generate an error detection code r2; a third XOR circuit may perform an XOR operation on data d2 to d4, d7 to d9, d11, d16 to d18, d20 to d23, d26 and d28 to d32 to generate an error detection code r3; and a fourth XOR circuit may perform an XOR operation on data d3, d5, d6, d9, d11, d14 to d16, d19, d23, d24, d28 and d30 to d32 to generate an error detection code r4. A fifth XOR circuit may perform an XOR operation on data d2, d4, d5, d8, d10, d13 to d15, d18, d22, d23, d27 and d29 to d31 to generate an error detection code r5; a sixth XOR circuit may perform an XOR operation on data d2 to d5, d8, d10 to d14, d20, d23 to d28, d30 and d32 to generate an error detection code r6; a seventh XOR circuit may perform an XOR operation on data d1 to d4, d7, d9 to d13, d19, d22 to d27, d29 and d31 to generate an error detection code r7; and an eighth XOR circuit may perform an XOR operation on data d1 to d3, d6, d8 to d12, d18, d21 to d26, d28 and d30 to generate an error detection code r8.

The example error detection code generation circuit shown in FIG. 4 may generate 2m-bit first error detection codes (c1 to c8; 1ec) and thus, the first error detection generator may generate an upper m-bit final error detection code (fec).

The conventional semiconductor memory device shown in FIG. 1 has one error detection code generator to generate an 8-bit final error detection code for 64-bit data in total, for example, whereas the example embodiment of the semiconductor memory device shown in FIG. 2 has two error detection code generators, each of the two error detection code generators having an error detection code generation circuit for generating an 8-bit error detection code for 32-bit data.

Therefore, each of the error detection code generators of the semiconductor memory device according to an example embodiment may generate an error detection code for data of fewer bits using an error detection code generation polynomial of the same order as used in the error detection code generator of the conventional semiconductor memory device, thereby upholding error detection performance.

Figure 5:
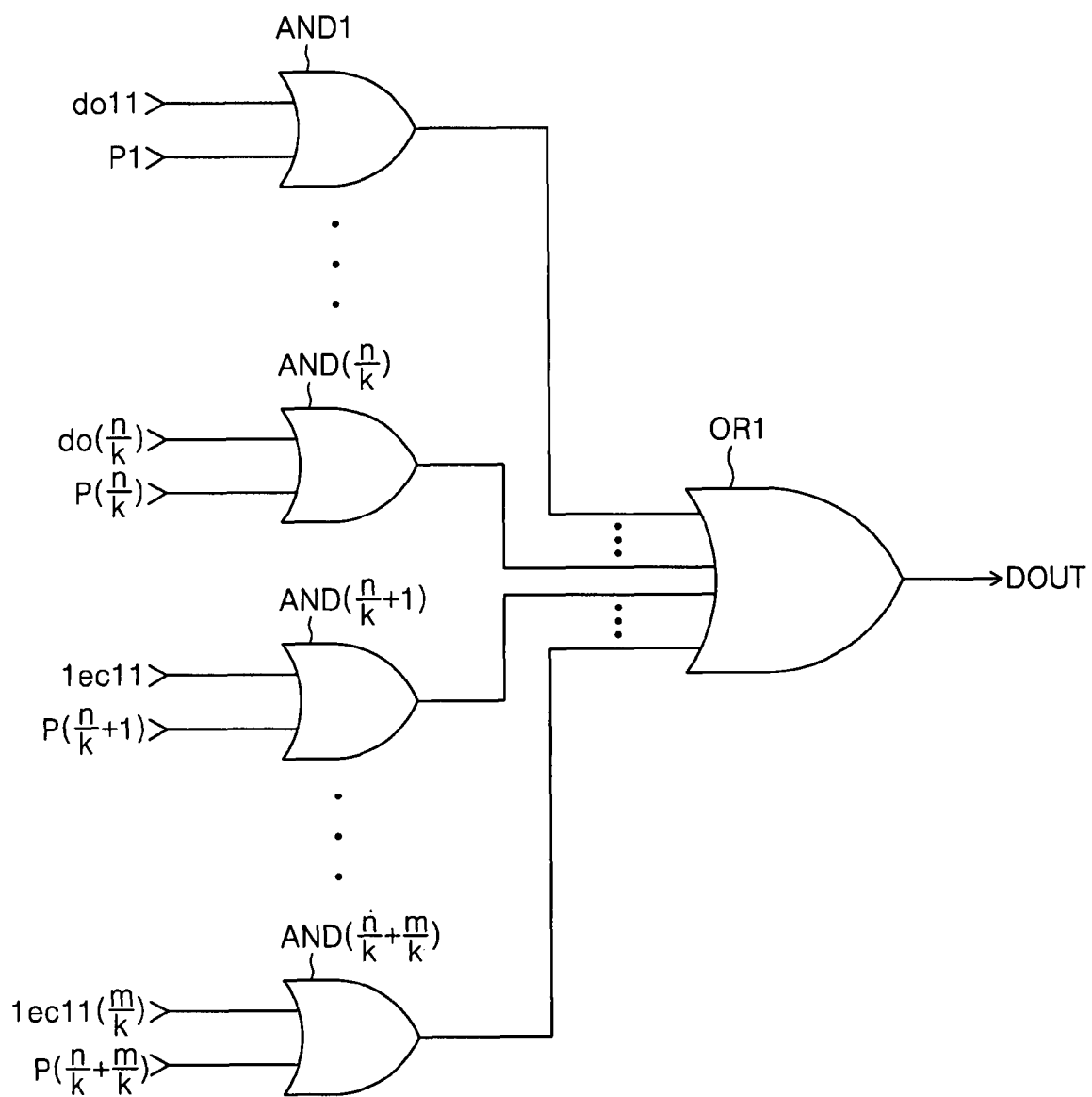
FIG. 5 illustrates example structures of parallel-serial converters shown in FIG. 2 in accordance with an example embodiment.

FIG. 5 illustrates an example configuration, which may be used for each of the parallel-serial converters shown in FIG. 2. As shown in FIG. 5, the example configuration may include AND gates AND1 to AND(n/k), AND(n/k+1) to AND(n/k+m/k), and an OR gate OR1, for example.

In the example configuration illustrated in FIG. 5, do11 to do(n/k) indicate n/k-bit data, 1ec11 to 1ec1(m/k) indicate an m/k-bit error detection code, P1 to P(n/k+m/k) indicate clock signals having different phases from each other, and DOUT indicates output data.

Each of the AND gates AND1 to AND(n/k+m/k) may sequentially output (n/k+m/k)-bit data and an error detection code in response to the respective (n/k+m/k) clock signals P1 to P(n/k+m/k). The OR gate OR1 may perform an XOR operation on data output from all of the AND gates AND1 to AND(n/k+m/k) to generate the output data DOUT. Accordingly, the (n/k+m/k)-bit data and the error detection codes may be converted to serial data and then output.

The example parallel-serial converter shown in FIG. 5 may output n/k-bit data and then may output the m/k-bit error detection code. Alternatively, the example parallel-serial converter may first transmit the error detection code and then transmit data. In still another alternative, the example parallel-serial converter may transmit the error detection code while the data are transmitted.

Figure 6:
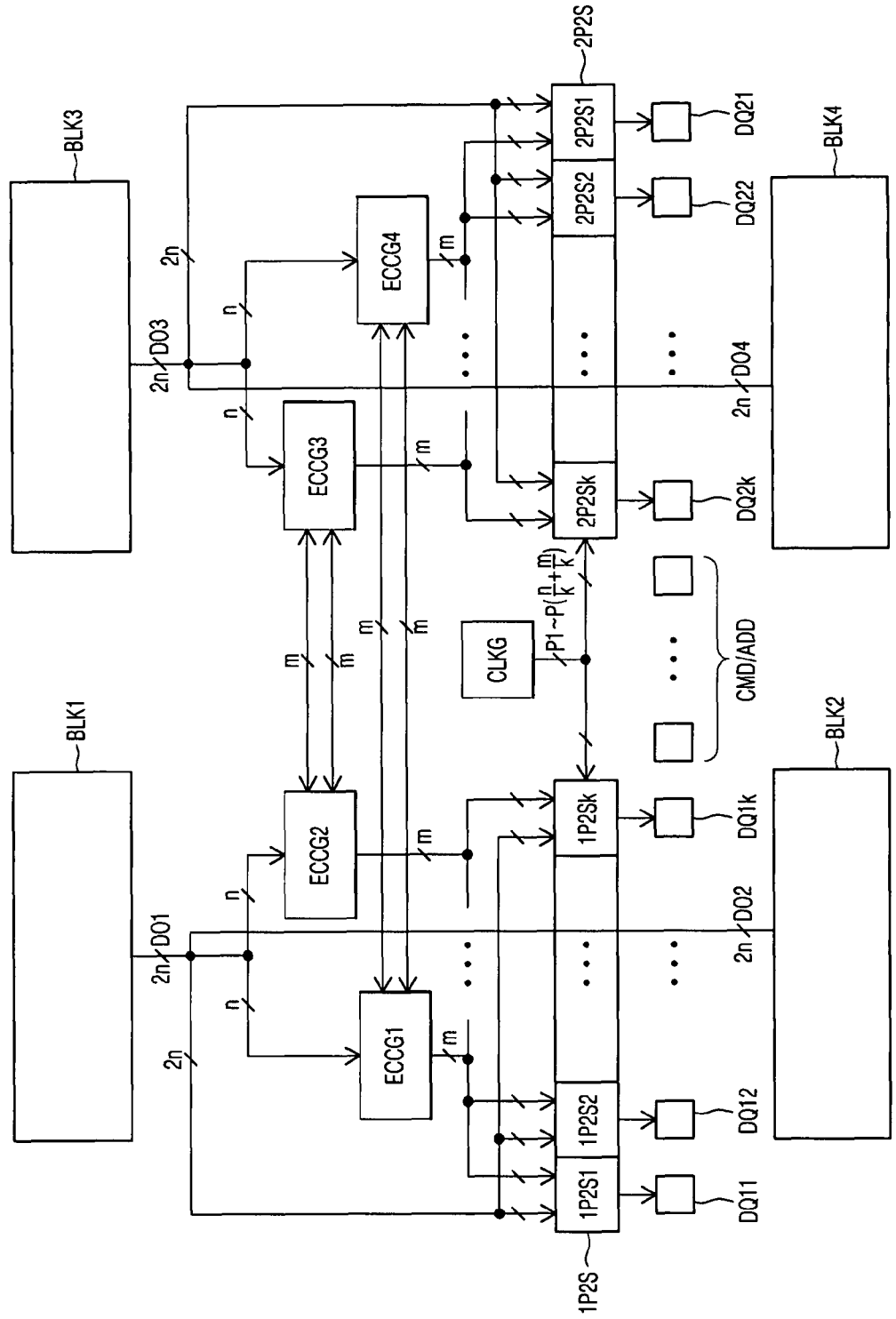
FIG. 6 is a block diagram of a semiconductor memory device having an ODIC pad structure in accordance with another example embodiment.

FIG. 6 is a block diagram of a semiconductor memory device having an ODIC pad structure according to another example embodiment. The semiconductor memory device may include first to fourth memory cell array blocks BLK1 to BLK4, first to fourth error detection code generators ECCG1 to ECCG4, first and second parallel-serial converters 1P2S and 2P2S, and a clock signal generator CLKG, for example. The first and second parallel-serial converters 1P2S and 2P2S may have the same structure as those of FIG. 2.

The pads of FIG. 6 may be arranged with the same ODIC structure as that shown in FIG. 2. Accordingly, in the example embodiment shown FIG. 6, DQ11 to DQ1$k$ indicates a first group of data pads and DQ21 to DQ2$k$ indicates a second group of data pads. Further, data DO1 to DO4 indicate 2n-bit data output from the first to fourth memory cell array blocks BLK1 to BLK4, respectively.

The semiconductor memory device shown in FIG. 6 may selectively output a total of 4n bits of data output from the first and fourth memory cell array blocks BLK1 and BLK4 or a total of 4n bits of data output from the second and third memory cell array blocks BLK2 and BLK3.

Example functions of the components of the semiconductor memory device of FIG. 6 are described below.

The first error detection code generator ECCG1 may generate a 2m-bit first error detection code for the lower n-bits of 2n-bit data DO1 or DO2 output from the first or second memory cell block BLK1 or BLK2 and may combine the upper m bits of the 2m bits of a first error detection code with the upper m bits of the 2m bits of a third error detection code output from the third error detection code generator ECCG3 to generate the lower m bits of the upper 2m bits of a final error detection code. The second error detection code generator ECCG2 may generate a 2m-bit second error detection code for the upper n bits of 2n-bit data DO1 or DO2 output from the first or second memory cell block BLK1 or BLK2 and may combine the upper m bits of the 2m-bit second error detection code with the upper m bits of the 2m-bit fourth error detection code output from the fourth error detection code generator ECCG4 to generate the upper m bits of the upper 2m-bit final error detection code. The third error detection code generator ECCG3 may generate 2m bits of the third error detection code for the lower n bits of 2n-bit data DO3 or DO4 output from the third or fourth memory cell block BLK3 or BLK4 and may combine the lower m bits of the 2m bits of the third error detection code with the lower m bits of the 2m bits of the first error detection code output from the first error detection code generator ECCG1 to generate the lower m bits of the lower 2m bits of a final error detection code. The fourth error detection code generator ECCG4 may generate a 2m-bit fourth error detection code for the upper n bits of 2n-bit data DO3 or DO4 output from the third or fourth memory cell block BLK3 or BLK4 and may combine the upper m bits of the 2m bits of fourth error detection code with the upper m bits of the 2m bits of second error detection code output from the second error detection code generator ECCG2 to generate the upper m bits of the lower 2m bits of a final error detection code. The clock signal generator CLKG may generate 2n/k+2m/k clock signals having different phases from each other in response to an externally applied clock signal (not shown). Alternatively, the clock signal generator may internally generate 2n/k+2m/k clock signals having different phases from each other. Each of the k parallel-serial converters 1P2S1 to 1P2S$k$ may convert data DO1 or DO2 in units of 2n/k bits and an upper final error detection code in units of 2m/k bits into serial data in response to the respective 2n/k+2m/k clock signals having different phases and may output the converted data through the corresponding pads DQ11 to DQ1$k$. Each of the k parallel-serial converters 2P2S1 to 2P2S$k$ may convert data DO3 or DO4 in units of 2n/k bits and a lower final error detection code in units of 2m/k bits to serial data in response to the respective clock signals having different phases from each other and may output the converted data through the corresponding pads DQ21 to DQ2$k$.

According to an example embodiment as shown in FIG. 6, the semiconductor memory device may have first and second error detection code generators ECCG1 and ECCG2, which may generate error detection codes for data output from the first or second memory cell array blocks BLK1 or BLK2 and may have third and fourth error detection code generators ECCG3 and ECCG4, which may generate error detection codes for data output from the third or fourth memory cell array blocks BLK3 or BLK4. In this example embodiment, relatively long signal lines are not required for transmitting the data DO1 or DO2 and data DO3 or D4. Accordingly, only 4 m signal lines for transmitting the m bits of error detection code output from each of the error detection code generators are relatively long. The number of 4 m signal lines is still relatively small as compared with the number of signal lines for transmitting the data and thus, a layout area of the semiconductor memory device having the ODIC pad structure according to this example embodiment may be reduced as compared with conventional semiconductor memory devices.

The error detection code generator of FIG. 6 may have the same structure as the error detection code generator of FIG. 3, and the error detection code generation circuit may have the same structure as the error detection code generation circuit of FIG. 4. Although not shown, the parallel-serial converters may have the same structure as the parallel-serial converters of FIG. 5.

If a total of 64 bits of data DO1 or DO2 are output from the first or second memory cell array block BLK1 or BLK2, the error detection code generation circuit of FIG. 4 may cause the first to fourth error detection code generators ECCG1 to ECCG4 generate error detection codes in units of 8 bits for data of 32 bits, and final error detection codes may be generated in units of 4 bits by the XOR gate of FIG. 3.

The example embodiment of the semiconductor memory device of FIG. 6 may generate the error detection code without degrading the error detection performance.

Figure 7:
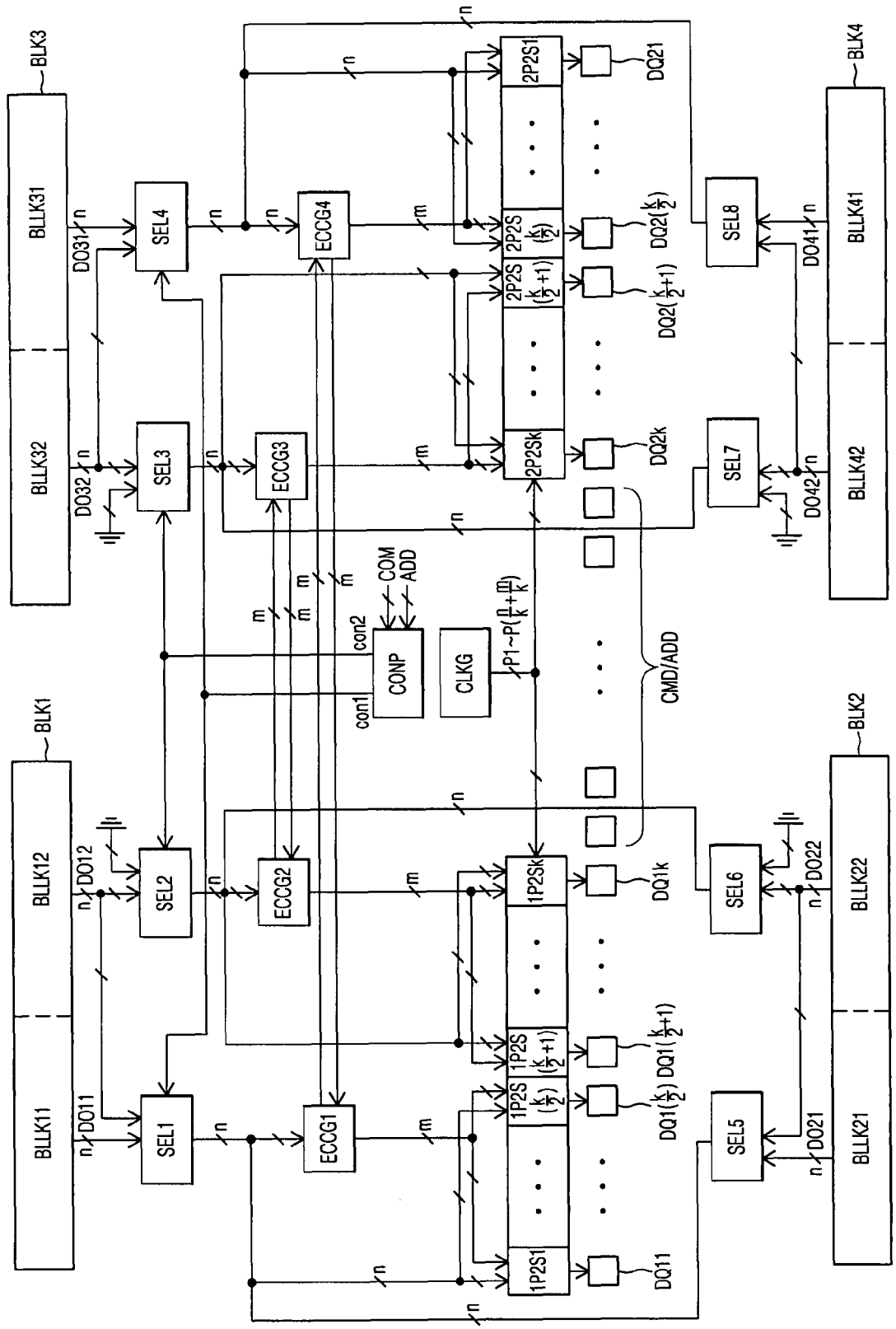
FIG. 7 is a block diagram of a semiconductor memory device having an ODIC pad structure in accordance with still another example embodiment.

FIG. 7 is a block diagram of a semiconductor memory device having an ODIC pad structure in accordance with still another example embodiment. As shown in FIG. 7, the example embodiment of the semiconductor memory device may include a first to fourth cell array blocks BLK1 to BLK4, first to eighth selectors SEL1 to SEL8, first to fourth error detection code generators ECCG1 to ECCG4, first and second parallel-serial converters 1P2S and 2P2S, a clock signal generator CLKG, and a control signal generator CONP. Each of the first to fourth memory cell array blocks BLK1 to BLK4 may include first and second sub memory cell array blocks (BLK11, BLK12) to (BLK41, BLK42). The first parallel-serial converter 1P2S may include k parallel-serial converters 1P2S1 to 1P2Sk, and the second parallel-serial converter 2P2S may include k parallel-serial converters 2P2S1 to 2P2Sk.

The pads of FIG. 7 have an ODIC pad structure. In FIG. 7, DQ11 to DQ1$k$ may indicate a first group of data pads and DQ21 to DQ2$k$ may indicate a second group of data pads. 2n bits of data (DO11, DO12), (DO21, DO22), (DO31, DO32), and (DO41, DO42) may indicate first and second n-bit data output from the first to fourth memory cell array blocks BLK1 to BLK4, respectively.

The semiconductor memory device of FIG. 7 may operate in a first bit structure mode or a second bit structure mode. In a first bit structure mode, the semiconductor memory device may selectively output a total of 4n bits of data DO11, DO12, DO41, and DO42 from the first and fourth memory cell array blocks BLK1 and BLK4, or a total of 4n bits of data DO21, DO22, DO31, and DO32 from the second and third memory cell array blocks BLK2 and BLK3. In a second bit structure mode, the semiconductor memory device may selectively output 2n bits of data from the sub memory cell array blocks including any one of the first and second sub memory cell array blocks BLK11 and BLK12 of the first memory cell array block BLK1 and any one of the first and second sub memory cell array blocks BLK41 and BLK42 of the fourth memory cell array block BLK4. Alternatively, in a second bit structure mode, the semiconductor memory device may selectively output 2n bits of data from the sub memory cell array blocks including any one of the first and second sub memory cell array blocks BLK21 and BLK22 of the second memory cell array block BLK2 and any one of the first and second sub memory cell array blocks BLK31 and BLK32 of the third memory cell array block BLK3.

Example functions of the components of the semiconductor memory block blocks illustrated in FIG. 7 are described below.

If a command signal COM applied from address and command signal applying pads CMD/ADD is a mode setting command, the control signal generator CONP decodes the applied mode setting code to set a mode signal designating the first bit structure mode or the second bit structure mode. The control signal generator CONP may activate both of first and second control signals con1 and con2 if the command signal COM is a write or read command and the mode signal designates the first bit structure mode. The control signal generator CONP may deactivate the second control signal con2 and may activate or deactivate the first control signal con1 in response to a column (or row) address of one bit if the mode signal designates the second bit structure mode. The column (or row) address of one bit may be used for dividing first and second sub memory cell array blocks of each of the memory cell array blocks BLK1 to BLK4. The first, fourth, fifth, and eighth selectors SEL1, SEL4, SEL5, and SEL8 may select and output first data DO11, DO31, DO21, and DO41, respectively, if the first control signal con1 is activated, and may select and output second data DO12, DO32, DO22, and DO42, respectively, if the first control signal con1 is deactivated. The second, third, sixth, and seventh selectors SEL2, SEL3, SEL6, and SEL7 may select and output second data DO12, DO32, DO22, and DO42 when the second control signal con2 is activated and may block the output of the data if the second control signal con2 is deactivated. The first to fourth error detection code generators ECCG1 to ECCG4 may perform substantially the same functions as the first to fourth error detection code generators previously described with respect to FIG. 6. Similarly, the first and second parallel-serial converters 1P2S and 2P2S may perform substantially the same functions as the first and second parallel-serial converters previously described with respect to FIG. 6. The clock signal generator CLKG may also perform substantially the same function as the clock signal generator previously described with respect to FIG. 6. Data may be output through the first and second groups of data pads DQ11 to DQ1$k$ and DQ21 to DQ2$k$ in the first bit structure mode and may be output through the first and second groups of data pads DQ11 to DQ1($k$/2) and DQ21 to DQ2($k$/2) in the second bit structure mode according to the example embodiment shown in FIG. 7.

The layout area of the semiconductor memory device having the ODIC pad structure of FIG. 7 may also be reduced as compared with conventional semiconductor devices.

The error detection code generator of FIG. 7 may have substantially the same structure as the error detection code generator of FIG. 3, and the error detection code generation circuit may have substantially the same structure as the error detection code generation circuit of FIG. 4. Although not shown, the parallel-serial converters may also have substantially the same structure as the parallel-serial converters of FIG. 5.

The semiconductor memory device of FIG. 7 may generate an error detection code and maintain error detection performance according to an example embodiment.

The first and fourth error detection code generators of FIGS. 6 and 7 may be configured using the same error detection code generation polynomial as the second and third error detection code generators. Alternatively, the first and fourth error detection code generators of FIGS. 6 and 7 may be configured using error detection code generation polynomials different from the second and third error detection code generators. If different error detection code generation polynomials are used, the structure of the first and fourth error detection code generators is also different from the structure of the second and third error detection code generators.

Figure 8:
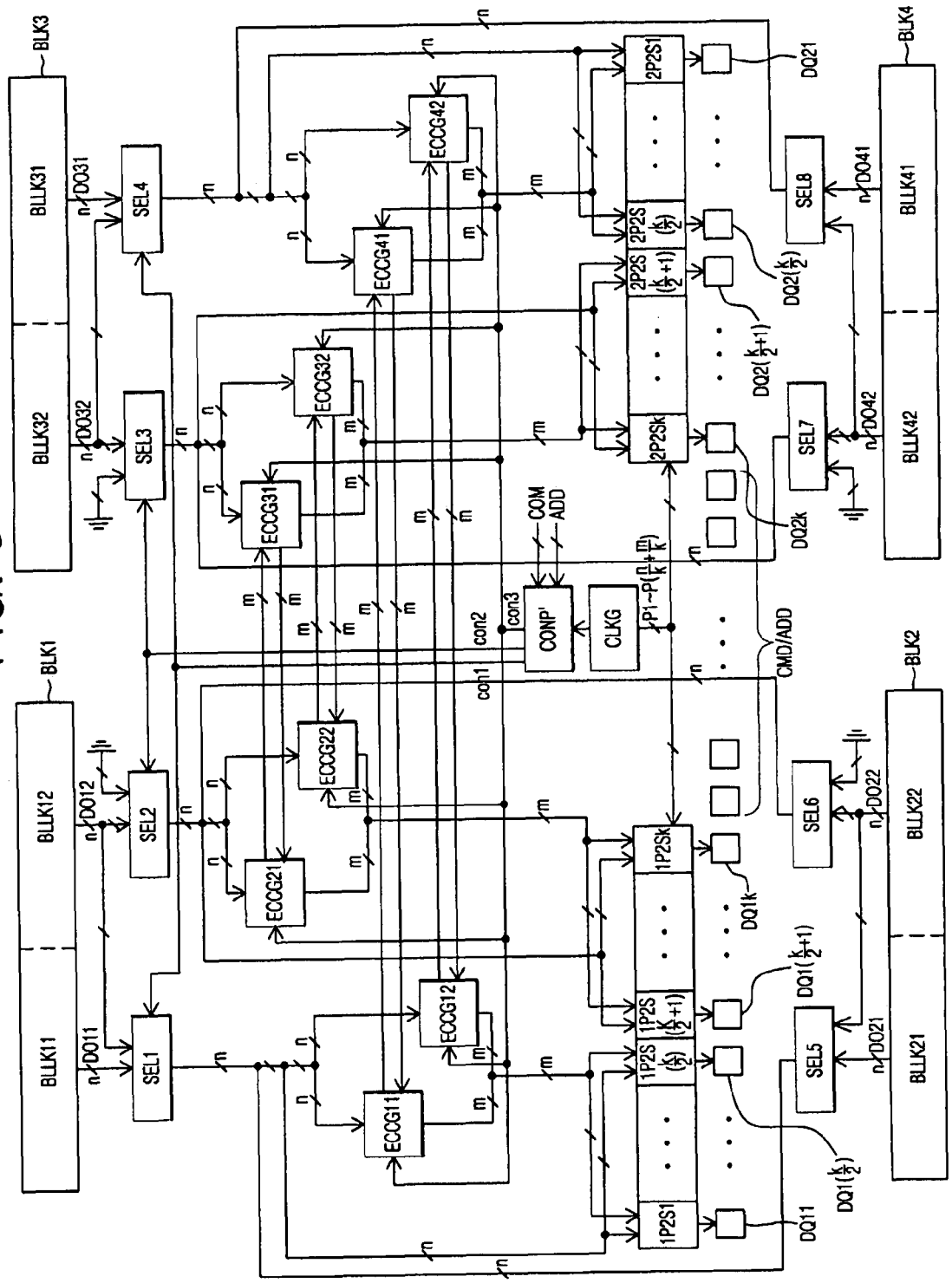
FIG. 8 is a block diagram of a semiconductor memory device having an ODIC pad structure in accordance with still another example embodiment.

FIG. 8 is a block diagram of a semiconductor memory device having an ODIC pad structure according to still another example embodiment. The semiconductor memory device may have substantially the same structure as the semiconductor memory device of FIG. 7 except that the first to fourth error detection code generators ECCG1 to ECCG4 may be replaced with two first to fourth error detection code generators ECCG11, ECCG12 to ECCG41, ECCG42 and the control signal generator CONP may be replaced with a control signal generator CONP'.

A description of functions of the components of the semiconductor memory device of FIG. 8, which are substantially the same as the components of the semiconductor memory device of FIG. 7 are omitted for the sake of brevity and thus, only a description example functions of the replaced components shown FIG. 8 is provided below.

The two first to fourth error detection code generators ECCG11, ECCG12 to ECCG41, ECCG42 may be configured using different error detection code generation polynomials. For example, the error detection code generators ECCG1, ECCG21, ECCG31, and ECCG41 may be configured using the same error detection code generation polynomial and the error detection code generators ECCG12, ECCG22, ECCG32, and ECCG42 may be configured using different error detection code generation polynomials from the error detection code generators ECCG11, ECCG21, ECCG31, and ECCG41. Alternatively, the two error detection code generators ECCG11 and ECCG41 may be configured using the same error detection code generation polynomial, the error detection code generators ECCG21 and ECCG31 may be configured using different error detection code generation polynomials from the error detection code generators ECCG11 and ECCG41, the error detection code generators ECCG12 and ECCG42 may be configured using different error detection code generation polynomials from the error detection code generators ECCG11, ECCG41, ECCG21, and ECCG31, and the error detection code generators ECCG22 and ECCG32 may be configured using different error detection code generation polynomials from the error detection code generators ECCG11, ECCG41, ECCG21, ECCG31, ECCG12, and ECCG42. The control signal generator CONP', in addition to the example functions of the control signal generator CONP previously described with respect to FIG. 7, may count a desired and/or predetermined time in response to a clock signal generated from the clock signal generator CLKG and may periodically activate a third control signal con3 based on the count. The error detection code generators ECCG11, ECCG21, ECCG31, and ECCG41 may perform substantially the same operation as the error detection code generators previously described with respect to FIG. 7 if the third control signal con3 is activated. The error detection code generators ECCG12, ECCG22, ECCG32, and ECCG42 may perform substantially the same operation as the error detection code generators previously described with respect to FIG. 7 if the third control signal con3 is deactivated.

The semiconductor memory device of FIG. 8 may generate a final error detection code using the error detection code generators having periodically different structures according to an example embodiment.

The semiconductor memory device of FIG. 8 may have more and longer signal lines than the semiconductor memory devices previously described with respect to FIGS. 2, 6, and 7. However, the semiconductor device of FIG. 8 has a fewer number signal lines as compared to the number of signal lines generally present in conventional semiconductor memory devices. Therefore, the layout area of a semiconductor device according to the example embodiment of FIG. 8 may be reduced as compared to conventional semiconductor memory devices.

In addition, the semiconductor memory device of FIG. 8 may operate using error detection code generators having periodically different error detection code generation polynomials and thus, the error detection performance may be enhanced as compared to conventional semiconductor memory devices.

The above-described exemplary embodiments have been described using the semiconductor memory device having an ODIC pad structure. However, one skilled in the art will appreciate that the teachings of the example embodiments may also be applied to semiconductor devices having a pad structure other than the OIDC pad structure.

According to an example embodiment, if the semiconductor memory device of FIG. 8 is a Dynamic Random Access Memory (DRAM), the third control signal con3 may be generated in response to a refresh command (or cycle). For example, a method according to an example embodiment may include activating a third control signal con3 in response to a first refresh command (or cycle) and deactivating the third control signal con3 in response to a second refresh command (or cycle). That is, the third control signal con3 may only be toggled in response to the refresh command (or cycle).

Figure 9:
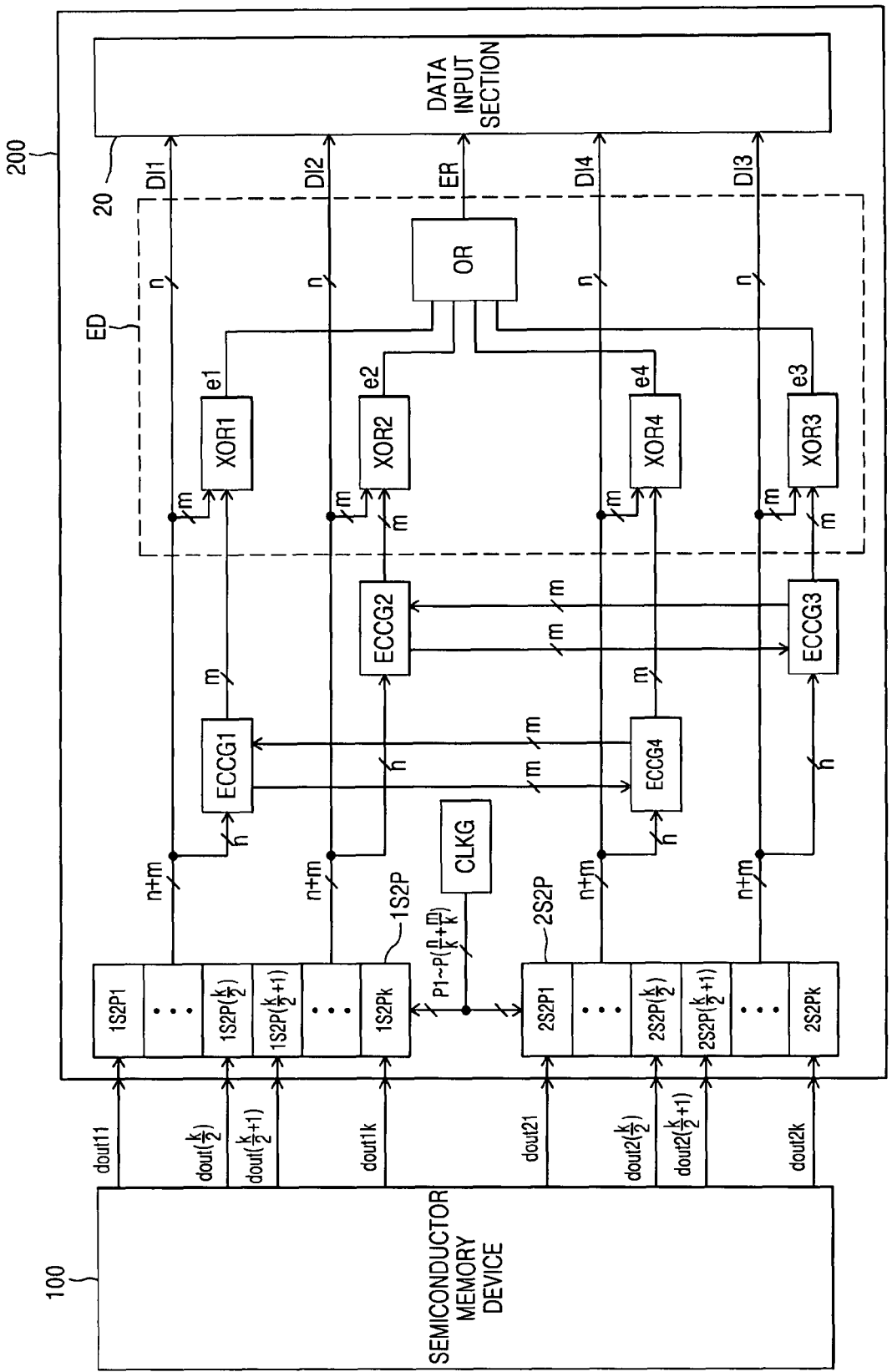
FIG. 9 illustrates an example configuration of a memory system in accordance with an example embodiment.

FIG. 9 illustrates an example configuration of a memory system according to an example embodiment. The memory system may include a semiconductor memory device 100 and a memory controller 200. The memory controller 200 may include first and second serial-parallel converters 1S2P and 2S2P, a clock signal generator CLKG, first to fourth error detection code generators ECCG1 to ECCG4, an error detector ED, and a data input section 20. The error detector ED may include XOR gates XOR1 to XOR4 and an OR gate OR as shown in FIG. 9. The first serial-parallel converter 1S2P may include k serial-parallel converters 1S2P1 to 1S2Pk, and the second serial-parallel converter 2S2P may include k serial-parallel converters 2S2P1 to 2S2Pk.

It is assumed for the following description that the semiconductor memory device 100 of the memory system of FIG. 9 has the same structure as the example embodiment of the semiconductor memory device of FIG. 7.

The error detection code generators ECCG1 to ECCG4 of the memory controller 200 of FIG. 9 may have a structure complying with the CRC code and using the same error detection code generation polynomial as previously described with respect to the first to fourth error detection code generators ECCG1 to ECCG4 of FIG. 6. Accordingly, the error detection code generators ECCG1 to ECCG4 of FIG. 9 may have substantially the same structure as the error detection code generators ECCG1 to ECCG4 of FIG. 6.

Referring to FIG. 9, data dout11 to dout1$k$ may indicate data output from the data pads DQ11 to DQ1$k$, respectively, and data dout21 to dout2$k$ may indicate data output from the data pads DQ21 to DQ2$k$, respectively.

Example functions of the blocks of FIG. 9 are described below.

The semiconductor memory device 100 may perform substantially the same functions as those previously described with respect to the semiconductor memory device of FIG. 6. For example, the clock signal generator CLKG may perform the same function as the clock signal generator CLKG of FIG. 6 and thus, may generate n/k+m/k clock signals P1 to P(n/k+m/k) having different phases. The serial-parallel converters 1S2P1 to 1S2Pk may receive upper data in units of n/k bits and an upper final error detection code in units of m/k bits that are applied in serial and may convert the data and upper final error detection code to parallel data in response to the respective n/k+m/k clock signals P1 to P(n/k+m/k), thereby generating upper 2n bits of data and upper final error detection codes of 2m bits. The serial-parallel converters 2S2P1 to 2S2Pk may receive lower data in units of n/k bits and a lower final error detection code in units of m/k bits that are applied in serial and may convert the lower data and the lower final error detection code into parallel data in response to the respective n/k+m/k clock signals P1 to P(n/k+m/k), thereby generating lower 2n bits of data and lower final error detection codes of 2m bits. The first to fourth error detection code generators ECCG1 to ECCG4 may generate the final error detection code in units of m bits. The XOR gates XOR1 to XOR4 may perform an XOR operation on the final error detection code in units of m bits output from the first to fourth error detection code generators ECCG1 to ECCG4, respectively, and the final error detection code in units of m bits output from the first and second serial-parallel converters to generate error detection signals e1 to e4. That is, each of the XOR gates XOR1 to XOR4 may output data "0" if the m bits of final error detection code output from the error detection code generator is equal to the corresponding m bits of final error detection code output from the serial-parallel converter and may otherwise output data "1". The OR gate OR may perform an OR operation on the error detection signals e1 to e4 to generate an error detection signal ER of "1" if at least one of the signals indicates "1". The data input section 20 may transmit 4n bits of data output from the first and second serial-parallel converters 1S2P and 2S2P if the error detection signal ER of "0" occurs, and may block transmission of the 4n bits of data output from the first and second serial-parallel converters 1S2P and 2S2P if the error detection signal ER of "1" occurs.

Although not shown, the error detection signal ER may be transmitted to the semiconductor memory device 100. In addition, the semiconductor memory device 100 may block transmission of the output data if the semiconductor memory device 100 receives an error detection signal ER of "1".

Figure 10:
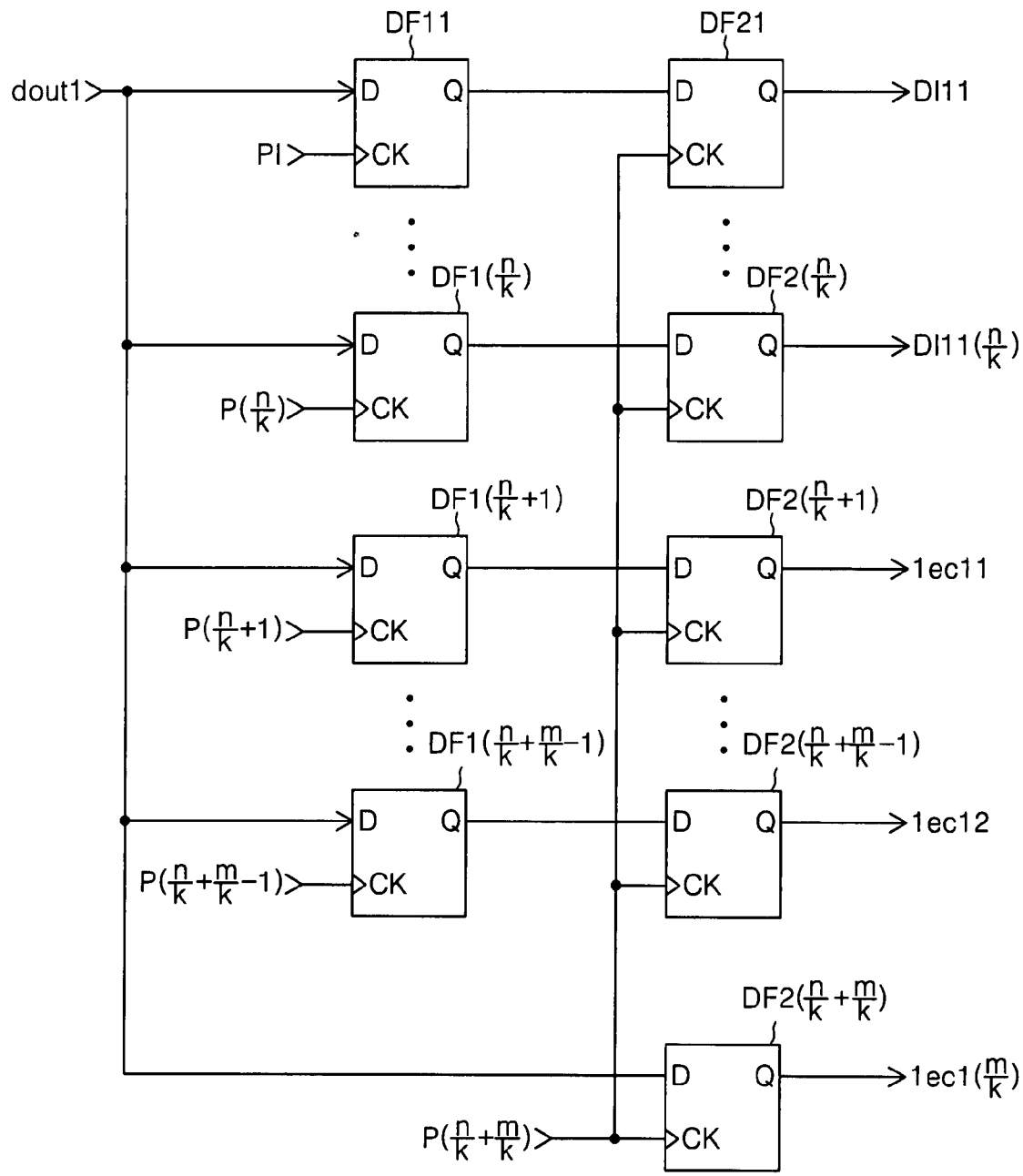
FIG. 10 illustrates an example configuration of parallel-serial converters shown in FIG. 9 in accordance with an example embodiment.

FIG. 10 illustrates an example configuration of each of the serial-parallel converters shown in FIG. 9 according to an example embodiment. The example configuration of each of the serial-parallel converters shown in FIG. 9 includes D flip-flops DF11 to DF1($n$/k+n/k−1), and DF21 to DF2($n$/k+m/k).

In the example configuration shown in FIG. 10, dout1 indicates n/k bits of serial input data and a m/k bits of serial input error detection code, DI11 to DI11 (n/k) indicate n/k bits of parallel output data, 1ec11 to 1ec1(m/k) indicate m/k bits of parallel output error detection code, and P1 to P(n/k+m/k) indicate clock signals having different phases from each other.

The D flip-fops DF11 to DF1($n$/k+m/k−1) may store and output n/k bits of data and first to (m/k−1)$^{th}$ error detection codes, which may be serially input in response to (n/k+m/k−1) clock signals, respectively. The D flip-fops DF21 to DF2($n$/k+m/k) may store data output from the respective D flip-flops DF11 to DF1($n$/k+m/k−1) and a (m/k)$^{th}$ input error detection code in response to the (n/k+m/k) clock signals, respectively, and may substantially simultaneously output n/k bits of parallel output data and m/k bits of parallel output error detection code. Accordingly, (n/k+m/k) bits of data and the error detection codes may be converted to parallel data and then output.

In addition, the semiconductor memory device of the memory system of the above-described example embodiment may have error detection code generators and parallel-serial converters to generate and transmit error detection codes for output data. However, the semiconductor memory device may also have serial-parallel converters, the error detection code generators, and the error detector which are disposed in the memory controller to generate an error detection signal for input data. The memory controller may also have the error detection code generators and the parallel-serial converters, which may be disposed in the semiconductor memory device, to generate and transmit an error detection code for output data.

The memory controller of the memory system of the above-described example embodiment may be configured to have a structure corresponding to the structure of FIG. 6. The memory controller may also be configured to have a structure corresponding to the example embodiments of the semiconductor memory devices of FIG. 2, 7, or 8.

The semiconductor memory device of the above-described example embodiments may be applied to a semiconductor memory device that does not have the ODIC pad structure.

The semiconductor memory device of the above-described example embodiments may have parallel-serial converters to output data, however, it may not have the parallel-serial converters to output parallel data. In the same way, the memory controller may have serial-parallel converters to input data, however, it may not have the serial-parallel converters to input parallel data.

A data transceiving method according to an example embodiment may be applied between a semiconductor memory device and a memory controller as well as to other data transceiving systems.

A layout area of a semiconductor memory device according to the example embodiments described above may be reduced as compared to conventional semiconductor memory devices having an ODIC pad structure and thus, semiconductor memory devices according to example embodiments may generate error detection codes without degrading error detection performance.

In addition, a memory system according to an example embodiment may use separate error detection code generators to generate error detection codes without degrading error detection performance.

Example embodiments have been disclosed herein and, although specific terms are employed, these specific terms are meant to be interpreted in a generic and descriptive sense only and not for the purpose of limitation. Accordingly, it will be understood by those of ordinary skill in the art that various changes in form and details may be made to the example embodiments described herein without departing from the spirit and scope as set forth in the following claims.

What is claimed is:

1. A semiconductor memory device, comprising:
a first memory cell array block generating first data;
a second memory cell array block generating second data;
a first error detection code generator generating a first error detection code for the first data, and combining a portion of bits of the first error detection code with a portion of bits of a second error detection code to generate a first final error detection signal; and a second error detection code generator generating the second error detection code for the second data, and combining remaining bits other than the portion of bits of the second error detection code with remaining bits other than the portion of bits of the first error detection code to generate a second final error detection signal.

2. The semiconductor memory device according to claim 1, further comprising:
a first parallel-serial converter converting the first data and the first final error detection signal to serial data and outputting the serial data; and
a second parallel-serial converter converting the second data and the second final error detection signal to serial data and outputting the serial data.

3. The semiconductor memory device according to claim 1, further comprising:
a plurality of pads arranged in an Outer Data Inner Control (ODIC) pad structure, the first error detection code generator being disposed adjacent to a first data pad outputting the first data and the first final error detection signal and the second error detection code generator being disposed adjacent to a second data pad outputting the second data and the second final error detection signal.

4. A memory system, comprising:
the semiconductor memory device of claim 1; and
a memory controller including
a third error detection code generator generating a third error detection code for the first data output from the semiconductor memory device, and combining a portion of bits of the third error detection code with a portion of bits of a fourth error detection code to generate a third final error detection signal;
a fourth error detection code generator generating the fourth error detection code for the second data output from the semiconductor memory device, and combining remaining bits other than the portion of bits of the fourth error detection code with remaining bits other than the portion of bits of the third error detection code to generate a fourth final error detection signal; and
an error detector comparing the first final error detection signal output from the semiconductor memory device with the third final error detection signal, and comparing the second final error detection signal output from the semiconductor memory device with the fourth final error detection signal to generate an error detection signal.

5. The memory system according to claim 4, wherein each of the first to fourth error detection code generators is based on a cyclic redundancy check code, each of the first and third error detection code generators has a first XOR circuit with a same first error detection code generation polynomial, and each of the second and fourth error detection code generators has a second XOR circuit with a same second error detection code generation polynomial that is different from the first error detection code generation polynomial.

6. The semiconductor memory device according to claim 1, further comprising:
a third error detection code generator generating a third error detection code for third data that is externally applied and combining a portion of bits of the third error detection code with a portion of bits of a fourth error detection code to generate a third final error detection signal;

a fourth error detection code generator generating the fourth error detection code for fourth data that is externally applied, and combining remaining bits other than the portion of bits of the fourth error detection code with remaining bits other than the portion of bits of the third error detection code to generate a fourth final error detection signal; and an error detector comparing an externally applied third final error detection signal with the third final error detection signal and comparing an externally applied fourth final error detection signal that is externally applied with the fourth final error detection signal to generate an error detection signal.

7. The semiconductor memory device according to claim 6, further comprising:
a first serial-parallel converter converting the externally applied third data and the third final error detection signal to parallel data and outputting the parallel data; and
a second serial-parallel converter converting the externally applied fourth data and the fourth final error detection signal to parallel data and outputting the parallel data.

8. The semiconductor memory device according to claim 5, wherein the error detector comprises:
a first XOR gate comparing the externally applied third final error detection signal with the third final error detection signal output from the third error detection code generator to generate a first comparison matching signal;
a second XOR gate comparing the externally applied fourth final error detection signal that is externally applied with the fourth final error detection signal output from the fourth error detection code generator to generate a second comparison matching signal; and
an OR gate performing an OR operation on the first and second comparison matching signals to generate the error detection signal.

9. The semiconductor memory device according to claim 6, wherein the third error detection code generator comprises:
a first error detection code generation circuit generating the third error detection code for the third data; and
a first combination circuit combining the portion of bits of the third error detection code with the portion of bits of the fourth error detection code to generate the third final error detection signal.

10. The semiconductor memory device according to claim 9, wherein the first combination circuit is an XOR gate performing an XOR operation on upper bits of the fourth error detection code and upper bits of the third error detection code to generate the third final error detection signal.

11. The semiconductor memory device according to claim 9, wherein the fourth error detection code generator comprises:
a second error detection code generation circuit generating the fourth error detection code for the fourth data; and
a second combination circuit combining the remaining bits other than the portion of bits of the fourth error detection code with the remaining bits other than the portion of bits of the third error detection code to generate the fourth final error detection signal.

12. The semiconductor memory device according to claim 11, wherein the second combination circuit is an XOR gate performing a XOR operation on lower bits of the fourth error detection code and lower bits of the third error detection code to generate the second final error detection signal.

13. The semiconductor memory device according to claim 11, wherein each of the first and second error detection code generation circuits is based on a cyclic redundancy check code and each of the first and second error detection code generation circuits has a XOR circuit with a same error detection code generation polynomial.

14. The semiconductor memory device according to claim 11, wherein each of the first and second error detection code generation circuits is based on a cyclic redundancy check code and each of first and second error detection code generation circuits has an XOR circuit with a different error detection code generation polynomial.

15. The semiconductor memory device according to claim 1, wherein the first error detection code generator comprises:
   a first error detection code generation circuit generating the first error detection code for the first data; and
   a first combination circuit combining the portion of bits of the first error detection code with the portion of bits of the second error detection code to generate the first final error detection signal.

16. The semiconductor memory device according to claim 15, wherein the first combination circuit is an XOR gate performing an XOR operation on upper bits of the first error detection code and upper bits of the second error detection code to generate the first final error detection signal.

17. The semiconductor memory device according to claim 15, wherein the second error detection code generator comprises:
   a second error detection code generation circuit generating the second error detection code for the second data; and
   a second combination circuit combining the remaining bits other than the portion of bits of the first error detection code with the remaining bits other than the portion of bits of the second error detection code to generate the second final error detection signal.

18. The semiconductor memory device according to claim 17, wherein the second combination circuit is an XOR gate performing an XOR operation on lower bits of the second error detection code and lower bits of the first error detection code to generate the second final error detection signal.

19. The semiconductor memory device according to claim 17, wherein each of the first and second error detection code generation circuits includes an XOR circuit based on a cyclic redundancy check code and has a same error detection code generation polynomial.

20. The semiconductor memory device according to claim 17, wherein each of the first and second error detection code generation circuits includes an XOR circuit based on a cyclic redundancy check code and each of the first and second error detection code generation circuits has a different error detection code generation polynomial.

21. The semiconductor memory device according to claim 17, further comprising:
   a third error detection code generator generating a third error detection code for the first data, and combining a portion of bits of the third error detection code with a portion of bits of a fourth error detection code to generate the first final error detection signal; and
   a fourth error detection code generator generating the fourth error detection code for the second data, and combining remaining bits other than the portion of bits of the fourth error detection code with remaining bits other than the portion of bits of the third error detection code to generate the second final error detection signal.

22. The semiconductor memory device according to claim 21, wherein the third error detection code generator comprises:
   a third error detection code generation circuit generating the third error detection code for the first data; and
   a third combination circuit combining the portion of bits of the third error detection code with the portion of bits of the fourth error detection code to generate the first final error detection signal.

23. The semiconductor memory device according to claim 22, wherein the third combination circuit is an XOR gate performing an XOR operation on upper bits of the third error detection code and upper bits of the fourth error detection code to generate the first final error detection signal.

24. The semiconductor memory device according to claim 21, wherein the fourth error detection code generator comprises:
   a fourth error detection code generation circuit generating the fourth error detection code for the second data; and
   a fourth combination circuit combining the remaining bits other than the portion of bits of the fourth error detection code with the remaining bits other than the portion of bits of the third error detection code to generate the second final error detection signal.

25. The semiconductor memory device according to claim 24, wherein the fourth combination circuit is an XOR gate performing an XOR operation on lower bits of the fourth error detection code and lower bits of the third error detection code to generate the second final error detection signal.

26. The semiconductor memory device according to claim 24, wherein each of the first to fourth error detection code generation circuits is based on a cyclic redundancy check code, each of the first and third error detection code generation circuits has a first XOR circuit with a different error detection code generation polynomial, and each of the second and fourth error detection code generation circuits has a second XOR circuit with another different error detection code generation polynomial.

27. The semiconductor memory device according to claim 26, further comprising:
   a controller for periodically and alternately enabling the first and second error detection code generators, and the third and fourth error detection code generators.

28. A semiconductor memory device, comprising:
   a first memory cell array block generating 2n bits of first data in a first bit structure mode, and generating n bits of the first data in a second bit structure mode;
   a second memory cell array block generating 2n bits of second data in the first bit structure mode, and generating n bits of the second data in the second bit structure mode;
   a first error detection code generator generating upper n bits of the 2n bits of the first data in the first bit structure mode, and a first error detection code for the n bits of the first data in the second bit structure mode, and combining a portion of bits of the first error detection code with a portion of bits of a third error detection code to generate a portion of bits of a first final error detection signal;
   a second error detection code generator generating a second error detection code for lower n bits of the 2n bits of the first data in the first bit structure mode, and combining a portion of bits of the second error detection code with a portion of bits of a fourth error detection code to generate remaining bits other than the portion of bits of the first final error detection signal;
   a third error detection code generator generating upper n bits of the 2n bits of the second data in the first bit structure mode, and the third error detection code for the n bits of the second data in the second bit structure mode, and combining remaining bits other than the portion of bits of the third error detection code with remaining bits other than the portion of bits of the first error detection code to generate a portion of bits of a second final error detection signal; and a fourth error detection code generator generating the fourth error detection code for lower n bits of the 2n bits of the second data in the first bit structure mode, and combining remaining bits other than the portion of bits of the fourth error detection code with remaining bits other than the portion of bits of the second error detection code to generate remaining bits other than the portion of bits of the second final error detection signal.

29. The semiconductor memory device according to claim 28, further comprising:

a first parallel-serial converter converting the 2n bits of the first data and 2m bits of the first final error detection signal in the first bit structure mode to serial data and outputting the serial data, and converting n bits of the first data and m bits of the first final error detection signal in the second bit structure mode to serial data and outputting the serial data; and a second parallel-serial converter converting the 2n bits of the second data and 2m bits of the second final error detection signal in the first bit structure mode to serial data and outputting the serial data.

30. The semiconductor memory device according to claim 28, further comprising:

a fifth error detection code generator generating upper n bits of 2n bits of externally applied third data in the first bit structure mode, and a fifth error detection code for n bits of the externally applied third data in the second bit structure mode, and combining a portion of bits of the fifth error detection code with a portion of bits of a seventh error detection code to generate a portion of bits of a third final error detection signal;

a sixth error detection code generator generating a sixth error detection code for lower n bits of the 2n bits of the externally applied third data in the first bit structure mode, and combining a portion of bits of the sixth error detection code with a portion of bits of an eighth error detection code to generate remaining bits other than the portion of bits of the third final error detection signal;

a seventh error detection code generator generating upper n bits of 2n bits of externally applied fourth data in the first bit structure mode, and the seventh error detection code for n bits of the externally applied fourth data in the second bit structure mode, and combining remaining bits other than the portion of bits of the seventh error detection code with remaining bits other than the portion of bits of the fifth error detection code to generate a portion of bits of a fourth final error detection signal;

an eighth error detection code generator generating the eighth error detection code for lower n bits of the 2n bits of the externally applied fourth data in the first bit structure mode, and combining remaining bits other than the portion of bits of the eighth error detection code with remaining bits other than the portion of bits of the sixth error detection code to generate remaining bits other than the portion of bits of the fourth final error detection signal; and an error detector comparing the third final error detection signal with an externally applied third final error detection signal, and comparing the fourth final error detection signal with an externally applied fourth final error detection signal to generate an error detection signal.

31. The semiconductor memory device according to claim 30, further comprising:

a first serial-parallel converter converting the 2n bits of the externally applied third data and 2m bits of the third final error detection signal in the first bit structure mode to parallel data and outputting the parallel data, and converting the n bits of the externally applied third data and m bits of the third final error detection signal in the second bit structure mode to parallel data and outputting the parallel data; and a second serial-parallel converter converting the 2n bits of the externally applied fourth data and 2m bits of the fourth final error detection signal in the first bit structure mode to parallel data and outputting the parallel data.

32. A memory system, comprising:

the semiconductor memory device of claim 28; and a memory controller including a fifth error detection code generator generating the upper n bits of 2n bits of the first data output from the semiconductor memory device in the first bit structure mode and a fifth error detection code for the n bits of the first data output from the semiconductor memory device in the second bit structure mode, and combining a portion of bits of the fifth error detection code with a portion of bits of a seventh error detection code to generate a portion of bits of a third final error detection signal;

a sixth error detection code generator generating a sixth error detection code for the lower n bits of the 2n bits of first data in the first bit structure mode, and combining a portion of bits of the sixth error detection code with a portion of bits of an eighth error detection code to generate remaining bits other than the portion of bits of the third final error detection signal;

a seventh error detection code generator generating the upper n bits of the 2n bits of the second data output from the semiconductor memory device in the first bit structure mode and the seventh error detection code for the n bits of the second data in the second bit structure mode, and combining remaining bits other than the portion of bits of the seventh error detection code with remaining bits other than the portion of bits of the fifth error detection code to generate a portion of bits of a fourth final error detection signal;

an eighth error detection code generator generating the eighth error detection code for the lower n bits of the 2n bits of the second data in the first bit structure mode, and combining remaining bits other than the portion of bits of the eighth error detection code with remaining bits other than the portion of bits of the sixth error detection code to generate remaining bits other than the portion of bits of the fourth final error detection signal; and an error detection signal generator comparing the first to fourth final error detection signals output from the semiconductor memory device to generate an error detection signal.

33. The memory system according to claim 32, wherein each of the first to eighth error detection code generators is based on a cyclic redundancy check code, each of the first and fifth error detection code generators has a first XOR circuit with a same first error detection code generation polynomial, each of the second and sixth error detection code generators has a second XOR circuit with a same second error detection code generation polynomial, each of the third and seventh error detection code generators has a third XOR circuit with a same third error detection code generation polynomial, and each of the fourth and eighth error detection code generators has a fourth XOR circuit with a same fourth error detection code generation polynomial.

34. The semiconductor memory device according to claim 28, wherein the first error detection code generator comprises:
a first error detection code generation circuit generating upper n bits of the 2n bits of the first data in the first bit structure mode, and 2m bits of the first error detection code for the n bits of the first data in the second bit structure mode; and
a first combination circuit combining upper m bits of 2m bits of the first error detection code with upper m bits of the 2m bits of the third error detection code to generate upper m bits of the first final error detection signal.

35. The semiconductor memory device according to claim 34, wherein the second error detection code generator comprises:
a second error detection code generation circuit generating 2m bits of the second error detection code for lower n bits of the 2n bits of the first data in the first bit structure mode; and
a second combination circuit combining upper m bits of 2m bits of the second error detection code with upper m bits of 2m bits of the fourth error detection code to generate lower m bits of the second final error detection signal.

36. The semiconductor memory device according to claim 35, wherein the third error detection code generator comprises:
a third error detection code generation circuit generating upper n bits of the 2n bits of the second data in the first bit structure mode, and 2m bits of the third error detection code for the n bits of the second data in the second bit structure mode; and
a third combination circuit combining lower m bits of 2m bits of the third error detection code with lower m bits of 2m bits of the first error detection code to generate upper m bits of the second final error detection signal.

37. The semiconductor memory device according to claim 36, wherein the fourth error detection code generator comprises:
a fourth error detection code generation circuit generating 2m bits of the fourth error detection code for lower n bits of the 2n bits of the second data in the first bit structure mode; and
a fourth combination circuit combining lower m bits of 2m bits of the fourth error detection code with lower m bits of 2m bits of the second error detection code to generate lower m bits of the second final error detection signal.

38. The semiconductor memory device according to claim 37, further comprising:
a fifth error detection code generator generating the upper n bits of the 2n bits of the first data in the first bit structure mode, and a fifth error detection code for the n bits of the first data in the second bit structure mode, and combining a portion of bits of the fifth error detection code with a portion of bits of a seventh error detection code to generate another portion of bits of the first final error detection signal;
a sixth error detection code generator generating a sixth error detection code for the lower n bits of the 2n bits of the first data in the first bit structure mode, and combining a portion of bits of the sixth error detection code with a portion of bits of an eighth error detection code to generate remaining bits other than the another portion of bits of the first final error detection signal;
a seventh error detection code generator generating the upper n bits of the 2n bits of second data in the first bit structure mode, and the seventh error detection code for the n bits of the second data in the second bit structure mode, and combining remaining bits other than the portion of bits of the seventh error detection code with remaining bits other than the portion of bits of the fifth error detection code to generate another portion of bits of the second final error detection signal; and
an eighth error detection code generator generating the eighth error detection code for the lower n bits of the 2n bits of the second data in the first bit structure mode, and combining remaining bits other than the portion of bits of the eighth error detection code with remaining bits other than the portion of bits of the sixth error detection code to generate remaining bits other than the another portion of bits of the second final error detection signal.

39. The semiconductor memory device according to claim 38, further comprising:
a plurality of pads arranged in an Outer Data Inner Control (ODIC) pad structure,
the first, second, fifth, and sixth error detection code generators being disposed adjacent to a first data pad outputting the first data and the first final error detection signal, and
the third, fourth, seventh, and eighth error detection code generators being disposed adjacent to a second data pad outputting the second data and the second final error detection signal.

40. The semiconductor memory device according to claim 38, wherein each of the first to eighth error detection code generators is based on a cyclic redundancy check code, each of the first to fourth error detection code generators has a first XOR circuit with a same first error detection code generation polynomial, and each of the fifth to eighth error detection code generators has a second XOR circuit with a same second error detection code generation polynomial that is different from the first error detection code generation polynomial.

41. The semiconductor memory device according to claim 40, further comprising:
a controller for periodically and alternately enabling the first to fourth error detection code generators, and the fifth to eighth error detection code generators.

42. A data transceiving system, comprising:
a data transmitter; and
a data receiver,
wherein the data transmitter includes:
a first error detection code generator generating a first error detection code for upper n bits of 2n bits of first data, and combining a portion of bits of the first error detection code with a portion of bits of a third error detection code to generate a portion of bits of a first final error detection signal;
a second error detection code generator generating a second error detection code for lower n bits of the 2n bits of first data, and combining a portion of bits of the second error detection code with a portion of bits of a fourth error detection code to generate remaining bits other than the portion of bits of the first final error detection signal;
a third error detection code generator generating the third error detection code for upper n bits of 2n bits of second data and combining remaining bits other than the portion of bits of the third error detection code with remaining bits other than the portion of bits of the first error detection code to generate a portion of bits of a second final error detection signal; and a fourth error detection code generator generating a fourth error detection code for lower n bits of the 2n bits of second data, and combining remaining bits other than the portion of bits of the fourth error detection code with remaining bits other than the portion of bits of the second error detection code to generate remaining bits other than the portion of bits of the second final error detection signal, the data transmitter outputting the first and second data in units of 2n bits and the first and second final error detection signals, and wherein the data receiver comprises:
a fifth error detection code generator generating a fifth error detection code for the upper n bits of the 2n bits of the first data, and combining a portion of bits of the fifth error detection code with a portion of bits of a seventh error detection code to generate a portion of bits of a third final error detection signal;

a sixth error detection code generator generating a sixth error detection code for the lower n, bits of the 2n bits of first data, and combining a portion of bits of the sixth error detection code with a portion of bits of an eighth error detection code to generate remaining bits other than the portion of bits of the third final error detection signal;

a seventh error detection code generator generating the seventh error detection code for the upper n bits of the 2n bits of the second data, and combining remaining bits other than the portion of bits of the seventh error detection code with remaining bits other than the portion of bits of the fifth error detection code to generate a portion of bits of a fourth final error detection signal;

an eighth error detection code generator generating the eighth error detection code for the lower n bits of the 2n bits of the second data, and combining remaining bits other than the portion of bits of the eighth error detection code with remaining bits other than the portion of bits of the sixth error detection code to generate remaining bits other than the portion of bits of the fourth final error detection signal; and an error detection signal generator comparing the first to fourth final error detection signals to generate an error detection signal.

43. The data transceiving system according to claim 42, wherein each of the first to eighth error detection code generators is based on a cyclic redundancy check code, each of the first and fifth error detection code generators has a first XOR circuit with a same first error detection code generation polynomial, each of the second and sixth error detection code generators has a second XOR circuit with a same second error detection code generation polynomial, each of the third and seventh error detection code generators has a third XOR circuit with a same third error detection code generation polynomial, and each of the fourth and eighth error detection code generators has a fourth XOR circuit with a same fourth error detection code generation polynomial.

* * * * *